(12) United States Patent
Domon et al.

(10) Patent No.: US 8,597,868 B2
(45) Date of Patent: Dec. 3, 2013

(54) NEGATIVE RESIST COMPOSITION AND PATTERNING PROCESS

(75) Inventors: Daisuke Domon, Joetsu (JP); Keiichi Masunaga, Joetsu (JP); Akinobu Tanaka, Joetsu (JP); Satoshi Watanabe, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 250 days.

(21) Appl. No.: 12/980,447

(22) Filed: Dec. 29, 2010

(65) Prior Publication Data

US 2011/0171579 A1   Jul. 14, 2011

(30) Foreign Application Priority Data

Jan. 13, 2010   (JP) .................................. 2010-004811

(51) Int. Cl.
*G03F 7/004* (2006.01)
*G03F 7/26* (2006.01)

(52) U.S. Cl.
USPC ........................................ 430/270.1; 430/322

(58) Field of Classification Search
USPC ....................... 430/270.1, 322, 927, 325, 330
See application file for complete search history.

(56) References Cited

U.S. PATENT DOCUMENTS

| 4,663,268 | A * | 5/1987 | Turner et al. ................ 430/270.1 |
| 6,673,512 | B1 * | 1/2004 | Uenishi et al. .............. 430/270.1 |
| 7,037,638 | B1 | 5/2006 | Afzali-Ardakani et al. |
| 2004/0023151 | A1 * | 2/2004 | Takeda et al. ............... 430/270.1 |
| 2005/0277739 | A1 * | 12/2005 | Yang et al. ..................... 525/242 |
| 2006/0166133 | A1 | 7/2006 | Koitabashi et al. |
| 2006/0234158 | A1 * | 10/2006 | Hatakeyama ............... 430/270.1 |
| 2006/0247400 | A1 | 11/2006 | Sounik et al. |
| 2007/0238029 | A1 * | 10/2007 | Takei et al. ........................ 430/5 |
| 2008/0241751 | A1 | 10/2008 | Takeda et al. |
| 2009/0111053 | A1 | 4/2009 | Yamashita |
| 2009/0155698 | A1 * | 6/2009 | Yamada et al. .................... 430/5 |
| 2010/0009299 | A1 * | 1/2010 | Watanabe et al. .............. 430/326 |
| 2011/0129765 | A1 | 6/2011 | Tanaka et al. |

FOREIGN PATENT DOCUMENTS

| CN | 1825206 A | 8/2006 |
| EP | 1684118 A1 | 7/2006 |
| JP | 2002-049152 A | 2/2002 |
| JP | 2003-122011 A | 4/2003 |
| JP | 2004-149756 A | 5/2004 |
| JP | 2004-302440 A | 10/2004 |
| JP | 2006-169302 A | 6/2006 |
| JP | 2006-201532 A | 8/2006 |
| JP | 2006-215180 A | 8/2006 |
| JP | 2008-249762 A | 10/2008 |

OTHER PUBLICATIONS

Extended European Search Report dated Aug. 9, 2012, issued in corresponding European patent application No. 10016101.7.

* cited by examiner

*Primary Examiner* — Anca Eoff

(74) *Attorney, Agent, or Firm* — Westerman, Hattori, Daniels & Adrian, LLP

(57) ABSTRACT

A negative resist composition comprises a base polymer comprising recurring units having an alkylthio group and having a Mw of 1000-2500, an acid generator, and a basic component, typically an amine compound containing a carboxyl group, but not active hydrogen. A 45-nm line-and-space pattern with a low value of LER can be formed.

11 Claims, No Drawings

NEGATIVE RESIST COMPOSITION AND PATTERNING PROCESS

CROSS-REFERENCE TO RELATED APPLICATION

This non-provisional application claims priority under 35 U.S.C. §119(a) on Patent Application No. 2010-004811 filed in Japan on Jan. 13, 2010, the entire contents of which are hereby incorporated by reference.

TECHNICAL FIELD

This invention relates to a negative resist composition and more particularly, to a negative resist composition comprising an aromatic ring-bearing polymer for use in processing of semiconductor and photomask substrates, and a patterning process using the same.

BACKGROUND ART

To meet the recent demand for higher integration in integrated circuits, pattern formation to a finer feature size is required. In forming resist patterns with a feature size of 0.2 μm or less, chemically amplified resist compositions utilizing photo-generated acid as the catalyst are typically used in the art because of high sensitivity and resolution. Often, high-energy radiation such as UV, deep UV or electron beam (EB) is used as the light source for exposure of these resist compositions. Among others, the EB or EUV lithography is recognized most attractive because patterns of the finest size are expectable.

Resist compositions include positive ones in which exposed areas are dissolved away and negative ones in which exposed areas are left as a pattern. A suitable composition is selected among them depending on the desired resist pattern. In general, the chemically amplified negative resist composition comprises a polymer which is normally soluble in an aqueous alkaline developer, an acid generator which is decomposed to generate an acid upon exposure to light, and a crosslinker which causes the polymer to crosslink in the presence of the acid serving as a catalyst, thus rendering the polymer insoluble in the developer (sometimes, the crosslinker is incorporated in the polymer). Typically a basic compound is added for controlling the diffusion of the acid generated upon light exposure.

A number of negative resist compositions of the type comprising a polymer which is soluble in an aqueous alkaline developer and includes phenolic units as the alkali-soluble units were developed, especially as adapted for exposure to KrF excimer laser light. These compositions have not been used in the ArF excimer laser lithography because the phenolic units are not transmissive to exposure light having a wavelength of 150 to 220 nm. Recently, these compositions are recognized attractive again as the negative resist composition for the EB and EUV lithography capable of forming finer size patterns. Exemplary compositions are described in JP-A 2006-201532, JP-A 2006-215180, and JP-A 2008-249762.

As the required pattern size is reduced, more improvements are made on the negative resist composition of the type using hydroxystyrene units typical of the phenolic units. Now that the pattern reaches a very fine size of 0.1 μm or less, it becomes important to reduce the line edge roughness (LER) of such a fine pattern. While the EB lithography is expected to form a fine size pattern, a long time is taken for image writing as compared with the KrF or ArF lithography. For the EB lithography, a resist material with a high sensitivity is required to gain improved throughputs.

Known as the problem of substrate poisoning is a phenomenon that the profile of a pattern alters near a processable substrate, depending on the material of which the substrate is made. As the desired pattern size is reduced, even a minor profile alteration becomes significant. Particularly in processing a photomask blank having the outermost surface made of chromium oxynitride, if a pattern is formed on the chromium oxynitride layer using a chemically amplified negative resist composition, then an "undercut" problem arises, that is, the pattern is notched at positions in contact with the substrate. The prior art compositions fail to fully solve the undercut problem.

In the course of development of resist compositions as mentioned above, the resist compositions are required to exhibit not only a high resolution which is the fundamental function of a resist film, but also high etch resistance. This is because the resist film must be thinned as the pattern feature size is reduced. One known means for achieving such high etch resistance is by introducing a polycyclic compound containing aromatic ring and non-aromatic ring wherein the non-aromatic ring has a carbon-carbon double bond conjugated to the aromatic ring, like indene or acenaphthylene, into a hydroxystyrene-based polymer as an auxiliary component. This is disclosed in JP-A 2008-249762.

It is noted that similar polymers are known as the base polymer for use in positive resist compositions. For example, JP-A 2004-149756 proposes the use of a polymer having only an indene skeleton. JP-A 2006-169302 discloses a combination of acenaphthylene skeleton-bearing units with hydroxystyrene derivatives.

CITATION LIST

Patent Document 1: JP-A 2006-201532 (US 20060166133, EP 1684118, CN 1825206)
Patent Document 2: JP-A 2006-215180
Patent Document 3: JP-A 2008-249762
Patent Document 4: JP-A 2004-149756
Patent Document 5: JP-A 2006-169302
Patent Document 6: JP-A 2002-049152

DISCLOSURE OF THE INVENTION

Many proposals were made to overcome the outstanding problems of LER and undercut. In an attempt to form a pattern of finer feature size from a resist film having a thickness of not more than 100 nm, it is unlikely that appropriate properties are available from combinations of prior art materials, and improvements are wanted.

An object of the present invention is to provide a negative resist composition which has advantages including high sensitivity, low LER, high throughputs, and minimized substrate poisoning, and a patterning process using the same.

Heretofore, an attempt was made to use a material having a relatively low molecular weight like calixarene in order to form a finer size pattern at a high accuracy, as disclosed in Patent Document 6. However, since negative resist compositions resort to a change of solubility in alkaline developer resulting from a change of molecular weight, there arises a tradeoff that the molecular weight of a base polymer can be reduced at the sacrifice of sensitivity. Addressing the problems, the inventors intended to first solve the LER problem and supported a hypothesis that even when a styrene base polymer is used, the LER problem can be mitigated by reducing the molecular weight of the polymer. It was planned that a polymer with a low molecular weight was synthesized by effecting polymerization of monomers while adding a sulfur compound as a chain transfer agent to the polymerization system, and a resist composition was prepared using the polymer and processed to form a pattern with a low LER.

In fact, when a polymer having hydroxystyrene and chlorostyrene units as the styrene derivative units was synthesized in the presence of a chain transfer agent, the resulting polymer had a lower molecular weight than prior art polymers as in Patent Document 3. Quite unexpectedly, when a resist composition is prepared using this polymer, it exhibited a higher sensitivity than the prior art compositions. In an experiment of forming a 45-nm size pattern from the resist composition by EB image writing, such a fine size pattern having minimal LER could be formed without collapse. The present invention is predicated on this finding.

In one aspect, the invention provides a chemically amplified negative resist composition comprising (A) a base polymer, (B) an acid generator, and (C) a nitrogen-containing compound as a basic component. The base polymer is (i) a polymer comprising recurring units of the general formulae (1) and (2):

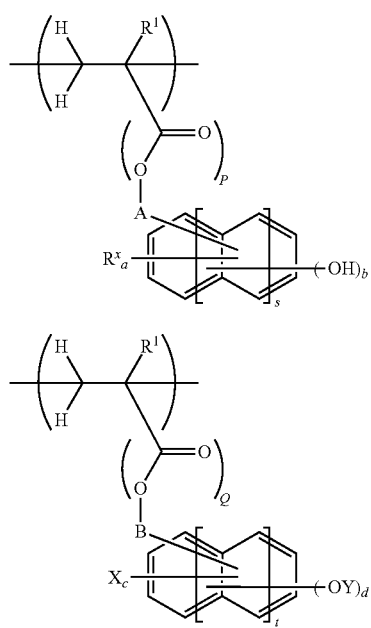

wherein A and B each are a single bond or a $C_1$-$C_{10}$ alkylene group which may be separated by an ether bond, $R^1$ is each independently hydrogen or methyl, $R^x$ is each independently hydrogen or a $C_1$-$C_6$ alkyl group, X is hydrogen, a straight, branched or cyclic $C_1$-$C_{20}$ alkyl group, $C_2$-$C_{20}$ alkoxyalkyl group, $C_2$-$C_{20}$ alkylthioalkyl group, halogen, nitro, cyano, sulfinyl or sulfonyl group, Y is a $C_1$-$C_{20}$ alkyl group or $C_2$-$C_{20}$ acyl group, a and c each are an integer of 0 to 4, b is an integer of 1 to 5, d is an integer of 0 to 5, P and Q each are 0 or 1, s and t each are an integer of 0 to 2, the polymer being combined with a crosslinker capable of forming crosslinks through electrophilic reaction with formula (1) in the presence of an acid, (ii) the polymer further comprising recurring units capable of forming crosslinks through electrophilic reaction with formula (1) in the presence of an acid, or (iii) the polymer further comprising recurring units having a crosslinking function, being combined with a crosslinker capable of forming crosslinks through electrophilic reaction with formula (1) in the presence of an acid. At least a portion of the base polymer has an alkylthio group of the general formula (3):

wherein $R^3$ is a straight, branched or cyclic $C_1$-$C_{20}$ alkyl group, $C_2$-$C_{20}$ hydroxyalkyl group, $C_2$-$C_{20}$ alkoxyalkyl group, $C_1$-$C_{20}$ mercaptoalkyl group or $C_2$-$C_{20}$ alkylthioalkyl group. The base polymer has a weight average molecular weight of 1,000 to 2,500.

In a preferred embodiment, the base polymer having the alkylthio group of formula (3) introduced therein is obtained from radical polymerization of a monomer mixture comprising monomers having the general formula (1a) and (2a):

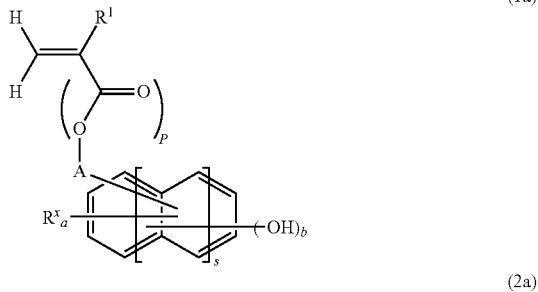

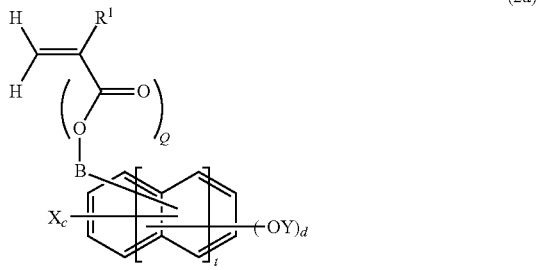

wherein A, B, $R^1$, $R^x$, X, Y, a, c, b, d, P, Q, s and t are as defined above, while using a compound of the general formula (20):

wherein $R^3$ is as defined above, as a chain transfer agent.

Since the alkylthio group is effective in increasing the efficiency of acid generation upon exposure, a resist film having a high sensitivity enough to improve the throughput of image writing is available. Since the polymer has a relatively low molecular weight, a resist film formed from the resist composition comprising the polymer can be processed into a pattern with a reduced LER. The polymer has a weight average molecular weight (Mw) of 1,000 to 2,500. If the Mw is too low, the pattern may be prone to thermal deformation. If the Mw is too high, some polymers may invite exaggerated LER.

Most preferably, the substituent X in formula (2) is a member selected from the group consisting of hydrogen atom, chlorine atom, bromine atom, iodine atom, methyl group, ethyl group, and a mixture thereof. The substituent Y in formula (2) is preferably methyl group and ethyl group. When these substituents are incorporated into the polymer, the bridge problem between features of a fine size pattern is significantly mitigated.

Also preferably the base polymer in the resist composition may further comprise recurring units of the general formula (4) or (5):

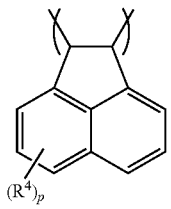
(4)

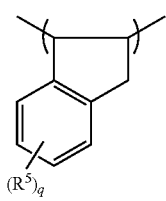
(5)

wherein $R^4$ and $R^5$ are each independently hydrogen, hydroxyl, a straight, branched or cyclic $C_1$-$C_{20}$ alkoxy group, a straight, branched or cyclic $C_1$-$C_{20}$ acyloxy group, an optionally hydroxy-substituted, straight, branched or cyclic $C_1$-$C_{20}$ alkyl group, or halogen, p is 0 or an integer of 1 to 6, and q is 0 or an integer of 1 to 4. Inclusion of these units provides high etch resistance, enabling to reduce the thickness of resist film.

In a preferred embodiment, the acid generator (B) comprises at least one compound having the general formula (6):

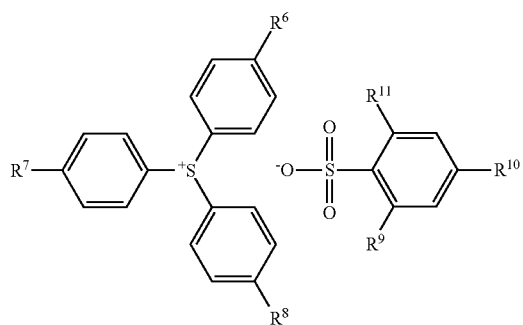
(6)

wherein $R^6$, $R^7$ and $R^8$ are each independently hydrogen or a straight or branched $C_1$-$C_4$ alkyl group, $R^9$, $R^{10}$ and $R^{11}$ are each independently a straight or branched $C_3$-$C_{10}$ alkyl group. When an acid generator generates a weak acid which is difficult to diffuse toward the substrate, a pattern with reduced undercuts can be formed. With this taken into account in combination with crosslinking efficiency, an optimum acid generator is selected in match with the polymer structure.

In a preferred embodiment, an amine compound having a carboxyl group, but free of hydrogen in covalent bond with nitrogen serving as basic center is used as basic component (C) which is a nitrogen-containing compound. The basic component comprises at least one compound selected from compounds having the general formulae (7) to (9).

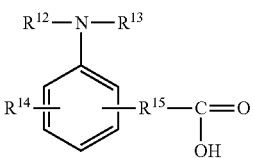
(7)

Herein $R^{12}$ and $R^{13}$ are each independently a straight, branched or cyclic $C_1$-$C_{20}$ alkyl group, $C_6$-$C_{20}$ aryl group, $C_7$-$C_{20}$ aralkyl group, $C_2$-$C_{20}$ hydroxyalkyl group, $C_2$-$C_{20}$ alkoxyalkyl group, $C_2$-$C_{20}$ acyloxyalkyl group, or $C_2$-$C_{20}$ alkylthioalkyl group, or $R^{12}$ and $R^{13}$ may bond together to form a ring structure with the nitrogen atom to which they are attached, $R^{14}$ is hydrogen, a straight, branched or cyclic $C_1$-$C_{20}$ alkyl group, $C_6$-$C_{20}$ aryl group, $C_7$-$C_{20}$ aralkyl group, $C_2$-$C_{20}$ hydroxyalkyl group, $C_2$-$C_{20}$ alkoxyalkyl group, $C_2$-$C_{20}$ acyloxyalkyl group, $C_2$-$C_{20}$ alkylthioalkyl group, or halogen, $R^{15}$ is a single bond, a straight, branched or cyclic $C_1$-$C_{20}$ alkylene group, or $C_6$-$C_{20}$ arylene group.

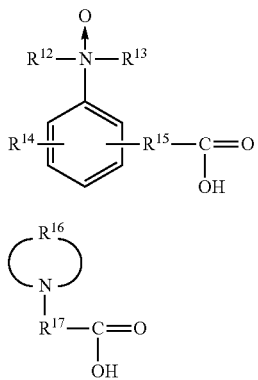
(8)

(9)

Herein $R^{12}$, $R^{13}$, $R^{14}$ and $R^{15}$ are as defined above, $R^{15}$ is an optionally substituted, straight or branched $C_2$-$C_{20}$ alkylene group whose carbon-carbon linkage may be separated by at least one carbonyl, ether, ester or sulfide group, and $R^{17}$ is a straight, branched or cyclic $C_1$-$C_{20}$ alkylene group or $C_6$-$C_{20}$ arylene group.

The basic component (C) may further comprise at least one compound selected from amine and amine oxide compounds having the general formulae (10) and (11).

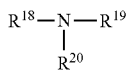
(10)

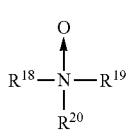
(11)

Herein $R^{18}$, $R^{19}$ and $R^{20}$ are each independently hydrogen, a straight, branched or cyclic $C_1$-$C_{20}$ alkyl group, $C_6$-$C_{20}$ aryl group, $C_7$-$C_{20}$ aralkyl group, $C_2$-$C_{20}$ hydroxyalkyl group, $C_2$-$C_{20}$ alkoxyalkyl group, $C_2$-$C_{20}$ acyloxyalkyl group, or $C_2$-$C_{20}$ alkylthioalkyl group, any two of $R^{18}$, $R^{19}$ and $R^{20}$ may bond together to form a ring structure or aromatic ring with the nitrogen atom to which they are attached.

In another aspect, the invention provides a process for forming a resist pattern, comprising the steps of applying the negative resist composition defined herein onto a processable substrate to form a resist film, exposing the film to a pattern of high-energy radiation, optionally post-exposure baking the film, and developing the exposed film with an aqueous alkaline developer. Since the resist composition defined herein is used, a finer resist pattern of a good profile can be formed.

The process is more effective when the resist film has a thickness of 10 nm to 100 nm. Typically the processable substrate is a photomask blank. The photomask blank may comprise a chromium compound film as the outermost layer.

Since a photomask governs all performance factors of a semiconductor device fabricated using the same, a minimal LER is required. For use in the etching of a sputter-deposited film having a relatively slow etching rate such as a transition metal-containing silicon compound film or a transition metal compound film, typically a chromium compound film, high etch resistance is necessary. Then the resist pattern forming process of the invention is advantageously used.

ADVANTAGEOUS EFFECTS OF INVENTION

Using the negative resist composition defined herein, a 45-nm line-and-space pattern with a minimal LER can be formed. On use of the polymer in combination with an amine compound having a carboxyl group, but free of hydrogen in covalent bond with nitrogen serving as basic center, a pattern of good profile having a minimal line width of 45 nm can be formed even on a processable substrate such as a chromium compound layer which is rather poisonous to invite undercuts, while overcoming the undercut problem.

DESCRIPTION OF EMBODIMENTS

As used herein, the singular forms "a," "an" and "the" include plural referents unless the context clearly dictates otherwise. "Optional" or "optionally" means that the subsequently described event or circumstances may or may not occur, and that description includes instances where the event or circumstance occurs and instances where it does not. The terminology "($C_x$—$C_y$)", as applied to a particular unit, such as, for example, a chemical compound or a chemical substituent group, means having a carbon atom content of from "x" carbon atoms to "y" carbon atoms per such unit.

The acronym LER stands for line edge roughness.

In a chemically amplified negative resist composition, a polymer comprising recurring hydroxystyrene units and recurring styrene units having electron attractive groups substituted thereon is often used as the base polymer. The process relies on the mechanism that the polymer is soluble in alkaline developer, but becomes substantially insoluble in the developer as a result of crosslinking reaction catalyzed by an acid. This polymer is still used as the resist polymer in EB lithography and EUV lithography even after the advanced UV lithography had shifted to the ArF lithography. When a fine size pattern is formed from the polymer by patternwise exposure to EB, the champion data of a line size of 50 nm from a resist film of 150 nm thick are marked as in Patent Document 3, for example. However, the inventors tried to form a pattern having a minimum line width of up to 50 nm using such a chemically amplified resist composition featuring a high resolution, finding that a fine size pattern collapsed or had a noticeable LER even when it could be formed. A high resolution could not be attained.

As previously mentioned, an attempt was made to use a material having a relatively low molecular weight like calixarene in order to form a finer size pattern at a high accuracy (see Patent Document 6). In the case of negative resist compositions comprising a styrene-based polymer, however, a polymer having a weight average molecular weight of less than 3,000 has never been employed in the art for the purpose of obtaining a satisfactory pattern profile. The reason is that in the case of negative resist compositions wherein a change of solubility in alkaline developer results from a change of molecular weight, if the molecular weight of a base polymer is reduced, the frequency of crosslink formation necessary for insolubilization must be remarkably increased. In fact, it is difficult to form a pattern of rectangular profile at a high sensitivity when a low molecular weight polymer is used.

With the goal of forming a finer size pattern in a practically acceptable manner, the inventors intended to first solve the LER problem and tried to gain a practically acceptable sensitivity by reducing the molecular weight of a polymer and making complimentary improvements.

It is known that a low molecular weight polymer can be more efficiently produced using a chain transfer agent during polymerization. The inventors planned to employ a sulfur compound as the chain transfer agent, to synthesize a low molecular weight polymer by adding the sulfur compound, to prepare a resist composition using the polymer, and to form a pattern with a minimal LER by processing the composition.

According to the plan, an attempt was made to reduce the molecular weight of a base polymer comprising hydroxystyrene and chlorostyrene units by adding a thiol serving as a chain transfer agent during synthesis. A resist composition was prepared using the resulting polymer and a pattern having a line width of 45 nm was formed therefrom. It was confirmed that the resulting pattern had a relatively low LER.

Quite unexpectedly from the general knowledge that the sensitivity of a resist film lowers as the molecular weight of a polymer is reduced, it has been found that a low molecular weight polymer which is synthesized while adding thiol during polymerization does not entail, by accident, a lowering of sensitivity inherent to a reduced molecular weight. This is due to a possibility that sulfur atoms incorporated into the polymer chain help increase the efficiency of acid generation from an acid generator in the resist film.

It is noted that the hypothesis described above is a mere explanation of the course of development of the invention and the scope and spirit of the invention are not bound by any theory.

The chemically amplified negative resist composition is defined as comprising (A) a base polymer, (B) an acid generator, and (C) a basic component. The base polymer (A) is a polymer comprising recurring units of the general formulae (1) and (2), containing an alkylthio group of the general formula (3), and having a weight average molecular weight (Mw) of 1,000 to 2,500.

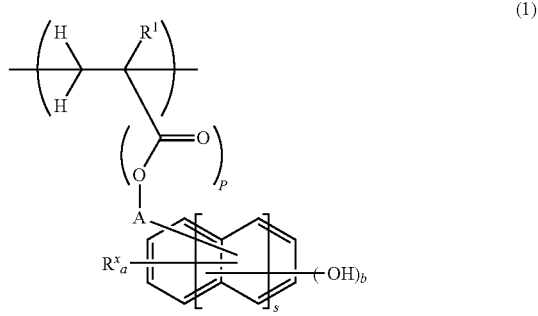

(1)

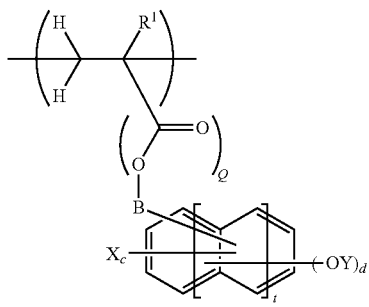
(2)

Herein A and B each are a single bond or a $C_1$-$C_{10}$ alkylene group which may be separated by an ether bond, $R^1$ is each independently hydrogen or methyl, $R^x$ is each independently hydrogen or a $C_1$-$C_6$ alkyl group, X is hydrogen, a straight, branched or cyclic $C_1$-$C_{20}$ alkyl group, $C_2$-$C_{20}$ (preferably $C_2$-$C_{10}$) alkoxyalkyl group, $C_2$-$C_{20}$ (preferably $C_2$-$C_{10}$) alkylthioalkyl group, halogen, nitro, cyano, sulfinyl or sulfonyl group, Y is a $C_1$-$C_{20}$ (preferably $C_1$-$C_6$) alkyl group or $C_2$-$C_{20}$ (preferably $C_2$-$C_7$) acyl group, a and c each are an integer of 0 to 4, b is an integer of 1 to 5, d is an integer of 0 to 5, P and Q each are 0 or 1, s and t each are an integer of 0 to 2.

(3)

Herein $R^3$ is a straight, branched or cyclic $C_1$-$C_{20}$ alkyl group, $C_2$-$C_{20}$ (preferably $C_2$-$C_{10}$) hydroxyalkyl group, $C_2$-$C_{20}$ (preferably $C_2$-$C_{10}$) alkoxyalkyl group, $C_1$-$C_{20}$ (preferably $C_1$-$C_{10}$) mercaptoalkyl group or $C_2$-$C_{20}$ (preferably $C_2$-$C_{10}$) alkylthioalkyl group.

The recurring units of formula (1) contribute to etch resistance, adhesion to a substrate, and solubility in an alkaline developer. These recurring units are already found in many resist compositions for the KrF excimer laser lithography and EB lithography including the patent documents cited above.

In formula (1), A is a single bond or a $C_1$-$C_{10}$ alkylene group which may be separated by an ether bond. Preferred examples of the alkylene group include methylene, ethylene, propylene, butylene, pentylene, hexylene, and structural isomers of carbon skeleton having branched or cyclic structure. For the alkylene group containing an ether bond, where P in formula (1) is 1, the ether bond may be incorporated at any position excluding the position between the α- and β-carbons relative to the ester oxygen. Where P in formula (1) is 0, the atom bonding with the main chain becomes an ethereal oxygen and a second ether bond may be incorporated at any position excluding the position between the α- and β-carbons relative to that ethereal oxygen. Alkylene groups having more than 10 carbon atoms are undesirable because of a low solubility in alkaline developer.

$R^x$ is each independently hydrogen or a $C_1$-$C_6$ alkyl group. Preferred examples of the $C_1$-$C_6$ alkyl group include methyl, ethyl, propyl, isopropyl, butyl, pentyl, hexyl, and structural isomers of carbon skeleton having branched or cyclic structure. Alkyl groups having more than 6 carbon atoms are undesirable because of a low solubility in alkaline developer.

The subscript "a" is an integer of 0 to 4, and "b" is an integer of 1 to 5. Preferably, a is an integer of 0 to 3 and b is an integer of 1 to 3 when s is 0. Also preferably, a is an integer of 0 to 4 and b is an integer of 1 to 5 when s is 1 or 2. The subscript s is an integer of 0 to 2. The structure represents a benzene skeleton when s=0, a naphthalene skeleton when s=1, and an anthracene skeleton when s=2.

Of the recurring units of formula (1), those recurring units wherein P is 0 and A is a single bond (meaning that the aromatic ring is directly bonded to the main chain of the polymer), that is, linker-free recurring units are units derived from monomers in which a 1-substituted or unsubstituted vinyl group is attached to a hydroxyl-substituted aromatic ring, as typified by hydroxystyrene units. Preferred examples include 3-hydroxystyrene, 4-hydroxystyrene, 5-hydroxy-2-vinylnaphthalene, and 6-hydroxy-2-vinylnaphthalene.

Those recurring units wherein P is 1, that is, recurring units having an ester structure as the linker are units of carbonyl-substituted vinyl monomers as typified by (meth)acrylates.

Preferred examples of the units of formula (1) having a linker (—CO—O-A-) derived from (meth)acrylates are shown below.

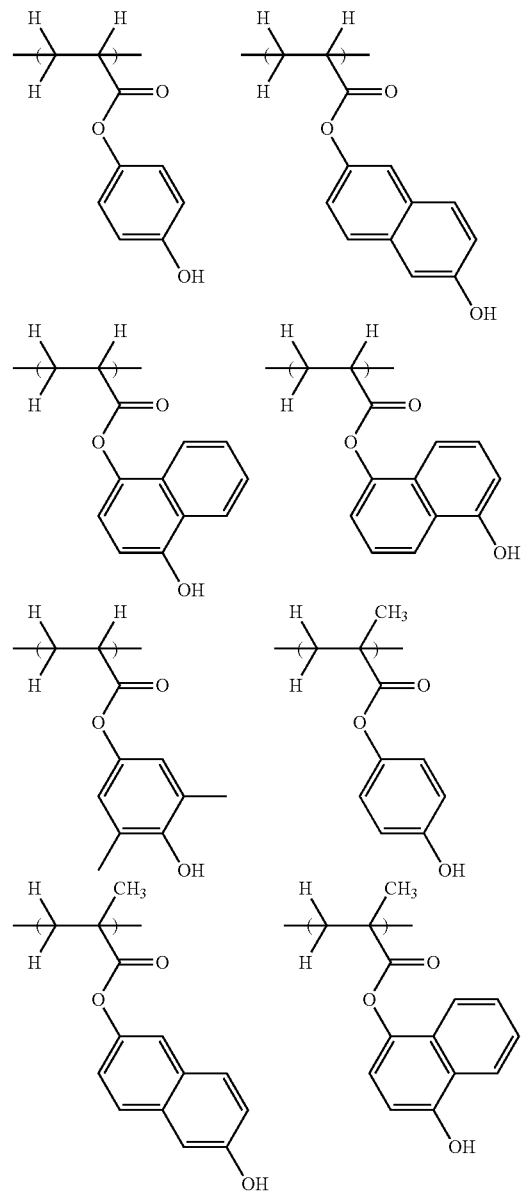

-continued

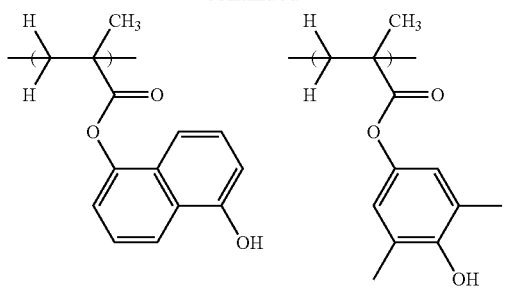

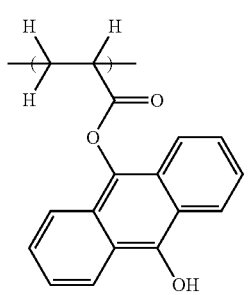

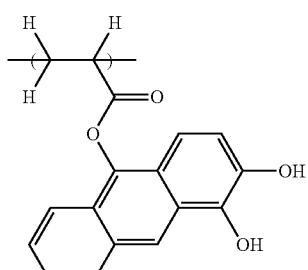

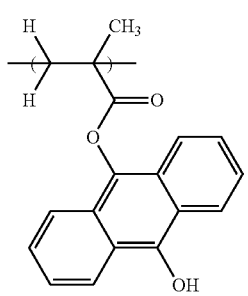

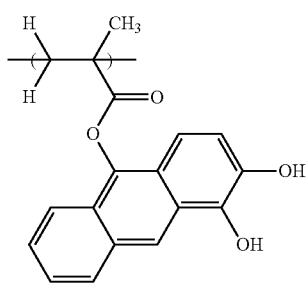

-continued

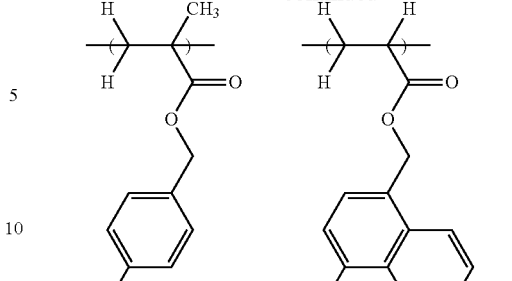

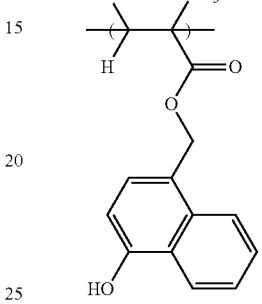

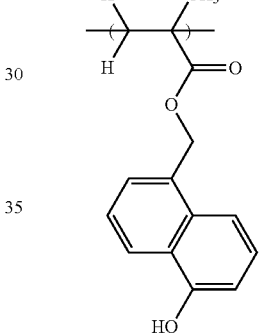

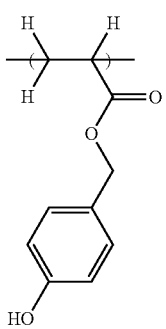

The recurring units of formula (2) contribute to etch resistance and control solubility in alkaline developer. Like formula (1), these recurring units are already found in many resist compositions for the KrF and EB lithography including the patent documents cited above.

In formula (2), B is a single bond or a $C_1$-$C_{10}$ alkylene group which may be separated by an ether bond. Preferred examples of the alkylene group include methylene, ethylene, propylene, butylene, pentylene, hexylene, and structural isomers of carbon skeleton having branched or cyclic structure. For the alkylene group containing an ether bond, where Q in formula (2) is 1, the ether bond may be incorporated at any position excluding the position between the α- and β-carbons relative to the ester oxygen. Where Q in formula (2) is 0, the atom bonding with the main chain becomes an ethereal oxygen and a second ether bond may be incorporated at any position excluding the position between the α- and β-carbons relative to that ethereal oxygen. Alkylene groups having more than 10 carbon atoms are undesirable because of a low solubility in alkaline developer.

X is hydrogen atom, a straight, branched or cyclic $C_1$-$C_{20}$ alkyl group, $C_2$-$C_{20}$ (preferably $C_2$-$C_{10}$) alkoxyalkyl group, $C_2$-$C_{20}$ (preferably $C_2$-$C_{10}$) alkylthioalkyl group, halogen atom, nitro group, cyano group, sulfinyl group or sulfonyl group. Preferred examples of X include hydrogen atom; chlorine atom, bromine atom and iodine atom as halogen atom;

and methyl group, ethyl group, propyl group, butyl group, pentyl group, hexyl group, structural isomers thereof, cyclopentyl group, and cyclohexyl group as alkyl group. Alkyl groups having more than 20 carbon atoms are undesirable because the resulting base polymer has a further reduced solubility in alkaline developer, with a risk of leaving scum or development defects.

Among the above preferred examples, hydrogen atom, chlorine atom, bromine atom, iodine atom, methyl group, ethyl group, methoxy group, and ethoxy group are more preferred since they are easily obtainable with good effect.

Y is a $C_1$-$C_{20}$ (preferably $C_1$-$C_6$) alkyl group or $C_1$-$C_{20}$ (preferably $C_2$-$C_7$) acyl group. When Y is alkyl, OY is alkoxy. When Y is acyl, OY is acyloxy. Preferred alkoxy groups include methoxy, ethoxy, propoxy, butoxy, pentyloxy, hexyloxy and a structural isomer of its hydrocarbon moiety, cyclopentyloxy, and cyclohexyloxy. Methoxy group and ethoxy group are more preferred. Introduction of an alkoxy group is effective for controlling bridges which tend to form when the resist film is formed as thin as 100 nm or less. While the acyloxy group may be readily introduced by the chemical modification technique even after polymerization, it may be advantageously utilized for fine adjustment of the solubility of a base polymer in an alkaline developer. Suitable acyloxy groups which can be preferably used herein include methylcarbonyloxy, ethylcarbonyloxy, propylcarbonyloxy, butylcarbonyloxy, pentylcarbonyloxy, hexylcarbonyloxy and a structural isomer thereof, cyclopentylcarbonyloxy, cyclohexylcarbonyloxy, and benzoyloxy.

The subscript c is an integer of 0 to 4, and d is an integer of 0 to 5. Preferably, c is an integer of 0 to 3 and d is an integer of 0 to 3 when t is 0. Also preferably, c is an integer of 0 to 4 and d is an integer of 0 to 5 when t is 1 or 2. The subscript t is an integer of 0 to 2. The structure represents a benzene skeleton when t=0, a naphthalene skeleton when t=1, and an anthracene skeleton when t=2.

Of the recurring units of formula (2), those recurring units wherein Q is 0 and B is a single bond (meaning that the aromatic ring is directly bonded to the main chain of the polymer), that is, linker-free recurring units have a fundamental structure which is a unit derived from monomers in which a 1-substituted or unsubstituted vinyl group is attached to an aromatic ring, as typified by styrene structure, having X and/or OY substituted thereon. Preferred examples of the fundamental structure include styrene, 2-vinylnaphthalene, and 3-vinylnaphthalene.

Those recurring units wherein Q is 1, that is, recurring units having an ester structure as the linker are units of carbonyl-substituted vinyl monomers as typified by (meth)acrylates.

Preferred examples of the fundamental structure in formula (2) having a linker (—CO—O—B—) derived from (meth)acrylates are shown below.

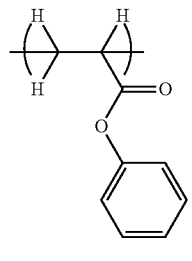
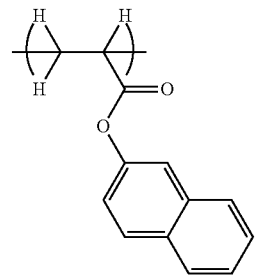
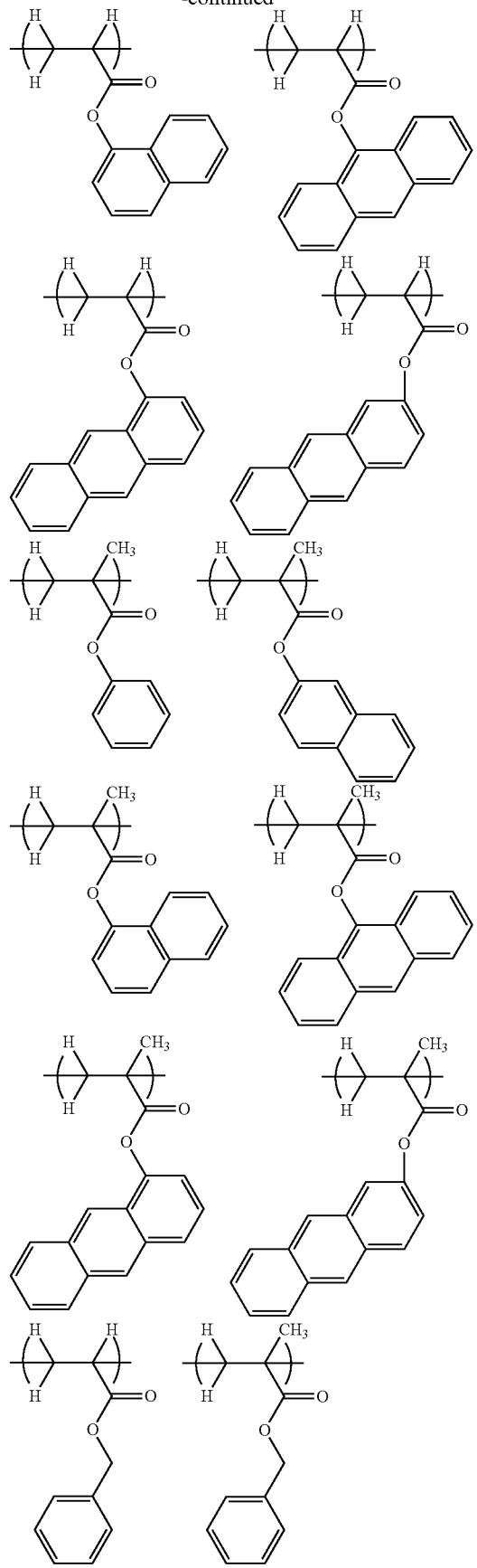

-continued
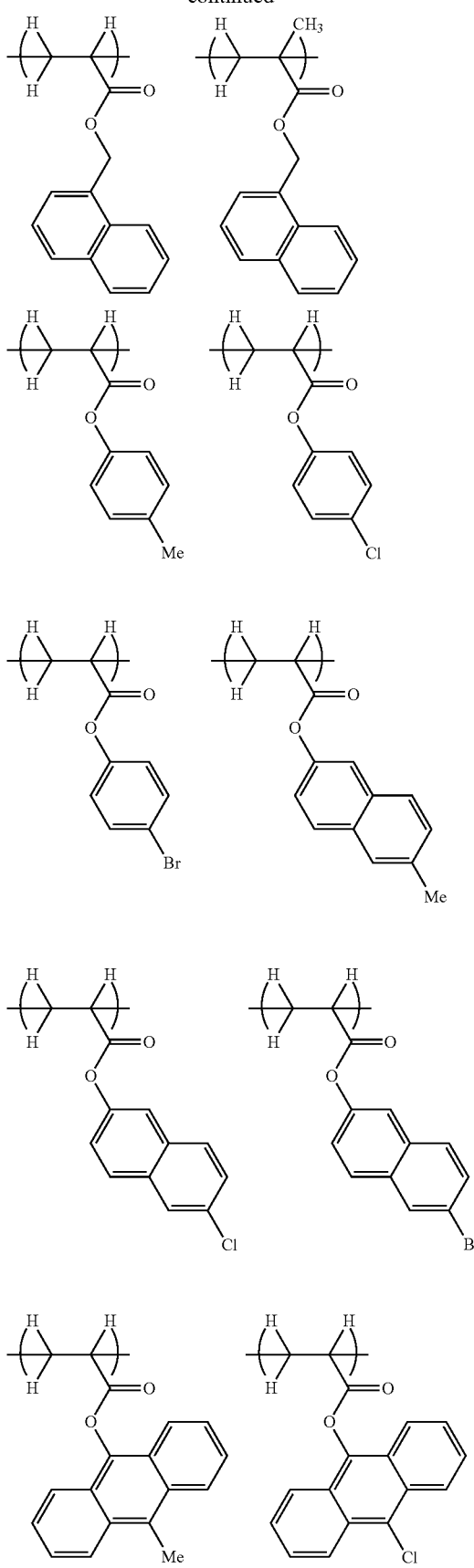
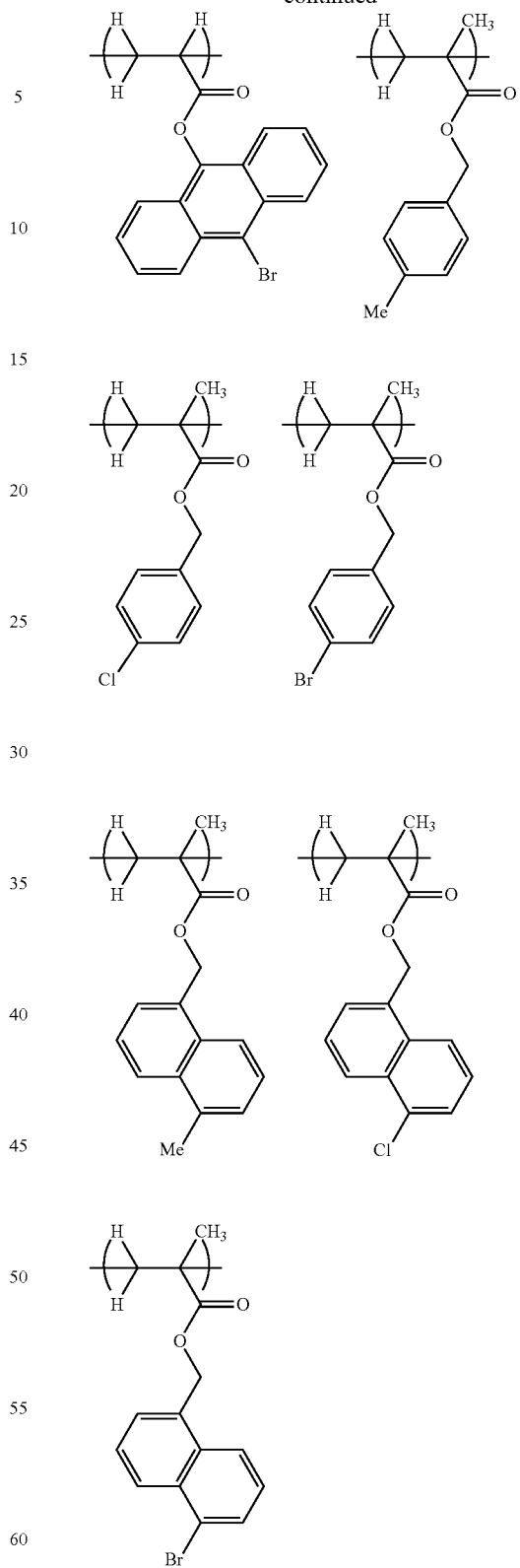
Herein Me stands for methyl.
In addition to the styrene derivatives described above, the base polymer used in the resist composition may further comprise recurring units of the general formula (4) or (5).

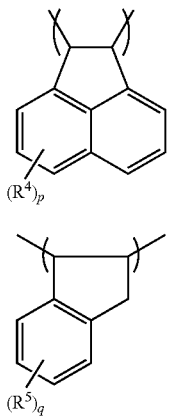

Herein R⁴ and R⁵ are each independently hydrogen, hydroxyl, a straight, branched or cyclic $C_1$-$C_{20}$ (preferably $C_1$-$C_{15}$) alkoxy group, a straight, branched or cyclic $C_1$-$C_{20}$ (preferably $C_1$-$C_{15}$) acyloxy group, an optionally hydroxy-substituted, straight, branched or cyclic $C_1$-$C_{20}$ alkyl group, or halogen, p is 0 or an integer of 1 to 6, and q is 0 or an integer of 1 to 4.

In formula (4) or (5), R⁴ and R⁵ are each independently selected from hydrogen atom, hydroxyl group, a linear, branched or cyclic alkoxy group having 1 to 20, preferably 1 to 15 carbon atoms, a linear, branched or cyclic acyloxy group having 1 to 20, preferably 1 to 15 carbon atoms, an unsubstituted or hydroxy group substituted, linear, branched or cyclic alkyl group having 1 to 15 carbon atoms, and a halogen atom. Preferred examples include hydrogen, hydroxyl, and halogen. Preferred examples of the acyloxy group include methylcarbonyloxy, ethylcarbonyloxy, propylcarbonyloxy, butylcarbonyloxy, pentylcarbonyloxy, hexylcarbonyloxy and a structural isomer thereof, cyclopentylcarbonyloxy, cyclohexylcarbonyloxy, and benzoyloxy. Suitable alkyl groups include methyl, ethyl, propyl, butyl, pentyl, hexyl and a structural isomer thereof, cyclopentyl, and cyclohexyl. Alkyl groups having more than 20 carbon atoms are undesirable because the resulting base polymer has a further reduced solubility in alkaline developer, with a risk of leaving scum or development defects. Suitable alkoxy groups include methoxy, ethoxy, propoxy, butoxy, pentyloxy, hexyloxy and a structural isomer of its hydrocarbon moiety, cyclopentyloxy, and cyclohexyloxy.

When recurring units of formula (4) or (5) are used, etch resistance is improved because a cyclic structure is incorporated into the main chain. When these units are incorporated in a low molecular weight polymer, the polymer molecule is endowed with robustness, leading to an ability to form a pattern of better profile.

The base polymer used herein is obtained from radical polymerization using a chain transfer agent. If recurring units of formula (4) are incorporated in an amount of far more than 30 mol % upon radical polymerization, the polymerization process may lose reproducibility (see Patent Document 3).

On the other hand, when recurring units of formula (5) are incorporated, no limits are imposed on the polymerization reaction. Thus a proportion of recurring units of formula (5) incorporated may be determined while taking into account a balance with an alkaline dissolution rate to be described later. Even polymers having recurring units of formula (5) incorporated in a proportion of up to about 50 mol % of the entire polymer may fall in the scope of polymers from which the benefits of the invention are obtainable.

As is well known in the art, the base polymer used in the negative resist composition becomes insoluble in alkaline developer when crosslinks are formed within and/or between polymer molecules by electrophilic reaction of a crosslinker in the presence of an acid catalyst. As is also well known in the art (see Patent Document 1, for example), the crosslinker may be partially or entirely replaced by introducing into the base polymer recurring units containing a functional group capable of forming crosslinks within and/or between polymer molecules by forming bonds with recurring units of formula (1) through electrophilic reaction, such as an oxirane ring or acetal structure.

Preferred examples of the recurring units capable of forming crosslinks by electrophilic reaction with recurring units of formula (1) include the following units M-1 and M-2.

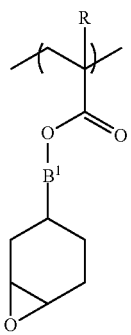

M-1

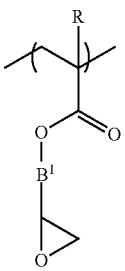

M-2

Herein R is hydrogen or methyl, $B^1$ is a single bond or a $C_1$-$C_{10}$ alkylene group which may be separated by an ether bond, $B^2$ is a $C_1$-$C_{10}$ alkylene group which may be separated by an ether bond, with the proviso that when $B^1$ and $B^2$ contain an ether bond, the ether bond is introduced at a remoter position than β-position relative to the ester oxygen.

Of the above recurring units, preference is given to units M-1. In particular, units M-1 wherein $B^1$ is a single bond, methylene or ethylene are more preferred because they do not detract from the robustness and etch resistance of the polymer.

It is noted that other recurring units may be added to the polymer used as the base polymer in the negative resist composition as long as the function of the polymer is not impaired. For example, a polymer may be used in which recurring units of formula (1) are in part substituted with acyl groups such as pivaloyl and acetyl groups for adjusting the dissolution rate of the polymer. Given that the other recurring units are not expected by the experts to be detrimental to the desired function, the advantages of the invention are maintained as long as a proportion of the other recurring units is up to 30 mol % of the overall recurring units of the polymer.

When the polymer used herein is prepared by copolymerization using respective monomers from which the recurring units are derived, the most important factor in the design of proportions of recurring units incorporated is a proportion of recurring units containing a phenolic hydroxyl group. This proportion must be adjusted in accordance with the recurring unit's own structure. As a guideline, the total of recurring units containing a phenolic hydroxyl group that provide the polymer with alkaline solubility is preferably 50 to 95 mol %, and more preferably 60 to 85 mol % of the overall recurring units of the polymer. If the total of recurring units containing a phenolic hydroxyl group is in excess of 95 mol %, the alkali dissolution rate of unexposed areas may become too high, raising some problems in pattern formation after development. If the total of recurring units containing a phenolic hydroxyl group is too low, there may arise problems such as difficult formation of a fine size pattern and residues after development.

A proportion of recurring units of formula (2) is preferably 5 to 50 mol %, and more preferably 15 to 40 mol % of the overall recurring units of the polymer. Notably, where the above-mentioned recurring units capable of forming crosslinks by electrophilic reaction with units of formula (1) are incorporated, the design is preferably tailored such that the total of recurring units capable of forming crosslinks and recurring units of formula (2) is 5 to 50 mol %, and more preferably 15 to 40 mol %.

Where a polymer consists of recurring units of formula (1), recurring units of formula (2), and optionally, recurring units capable of forming crosslinks by electrophilic reaction with units of formula (1), the design of formulation may be adjusted within the above-defined range. Where recurring units of formulae (4) and (5) are further incorporated, a discriminative design must be made depending on whether or not $R^4$ and $R^5$ in the recurring units are hydroxyl. Specifically, the recurring units of formula (4) or (5) wherein $R^4$ or $R^5$ is hydroxyl are regarded substantially equivalent to the recurring units of formula (1), whereas the recurring units of formula (4) or (5) wherein $R^4$ or $R^5$ does not contain hydroxyl are regarded substantially equivalent to the recurring units of formula (2). This gives a guideline in determining an incorporation proportion. However, since the units of formula (4) or (5) wherein $R^4$ or $R^5$ contains hydroxyl, in fact, serve to slightly reduce the solubility in alkaline developer as compared with the units of formula (1), an incorporation proportion of units of formula (1) and units of formula (4) and/or (5) should be slightly higher than that specified for the exclusive combination of units of formulae (1) and (2).

Where recurring units of formulae (4) and (5) are incorporated, the proportion of recurring units of formula (1) and/or recurring units of formula (2) incorporated is accordingly reduced. To ensure the benefits of the invention, it is preferred that the proportion of recurring units of formula (1) be at least 20 mol % and the proportion of recurring units of formula (2) be at least 1 mol %.

At least a portion of the base polymer used in the resist composition should have an alkylthio group of the general formula (3) in the polymer chain.

(3)

Herein $R^3$ is a straight, branched or cyclic $C_1$-$C_{20}$ alkyl group, $C_2$-$C_{20}$ (preferably $C_2$-$C_{10}$) hydroxyalkyl group, $C_2$-$C_{20}$ (preferably $C_2$-$C_{10}$) alkoxyalkyl group, $C_1$-$C_{20}$ (preferably $C_1$-$C_{10}$) mercaptoalkyl group, or $C_2$-$C_{20}$ (preferably $C_2$-$C_{10}$) alkylthioalkyl group. This alkylthio group is introduced using an alkylthiol as the chain transfer agent upon radical polymerization. Then the alkylthio group is fundamentally introduced into the base polymer at one end or both ends. Differently stated, a portion of the base polymer used in the resist composition may not contain the unit of formula (3).

For the base polymer used in the resist composition, preferred examples of a combination of recurring units are given below. It is noted that the recurring unit having a group of formula (3) is not depicted for simplicity's sake. Examples with no linker between main chain and aromatic ring:

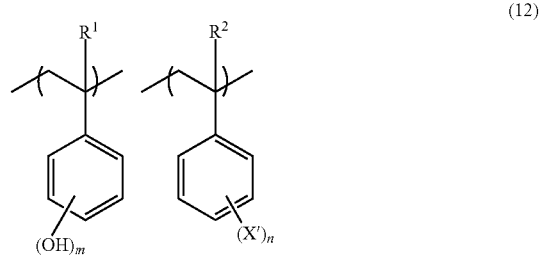

(12)

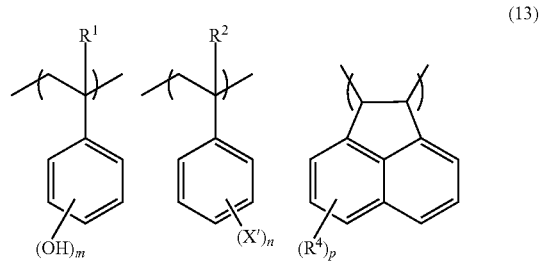

(13)

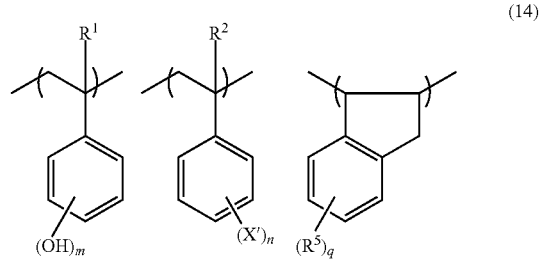

(14)

Herein, $R^1$ and $R^2$ are each independently hydrogen or methyl, X' is at least one group selected from among chlorine, bromine, iodine, methyl, ethyl, methoxy, and ethoxy, m and n each are an integer of 1 to 5. $R^4$ and $R^5$ are each independently hydrogen, hydroxyl, a straight, branched or cyclic $C_1$-$C_{20}$ alkoxy group, a straight, branched or cyclic $C_1$-$C_{20}$ acyloxy group, an optionally hydroxy-substituted, straight, branched or cyclic $C_1$-$C_{20}$ alkyl group, or halogen, p is 0 or an integer of 1 to 6, and q is 0 or an integer of 1 to 4.

Examples with linker between main chain and aromatic ring:

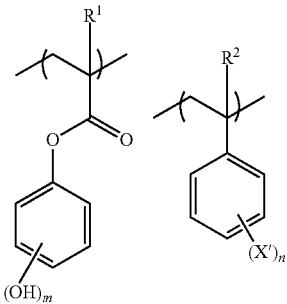
(15)

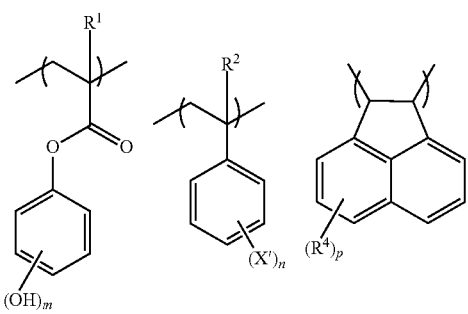
(16)

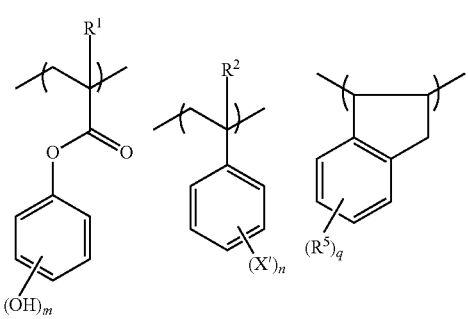
(17)

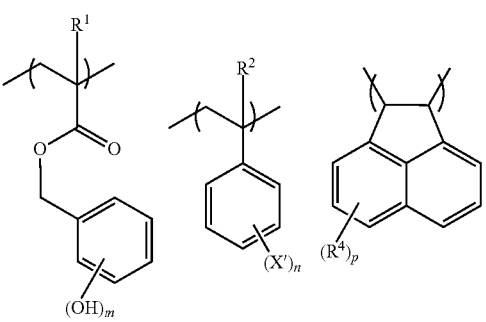
(18)

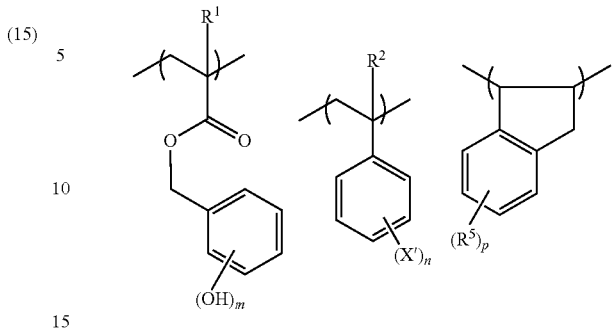
(19)

Herein, $R^1$, $R^2$, X', m, n, $R^4$, $R^5$, p and q are as defined above.

The polymer is synthesized by radical polymerization of corresponding monomers. During the polymerization, a thiol serving as the chain transfer agent is preferably added in an amount of 0.1 to 20 mol %, more preferably 1 to 10 mol % based on the total moles of the monomers, whereby a polymer having a molecular weight of 1,000 to 2,500 can be synthesized. The thiol used herein includes, but is not limited thereto, those having the general formula (20):

$$HS\text{—}R^3 \tag{20}$$

wherein $R^3$ is a straight, branched or cyclic $C_1$-$C_{20}$ alkyl group, $C_2$-$C_{20}$ (preferably $C_2$-$C_{10}$) hydroxyalkyl group, $C_2$-$C_{20}$ (preferably $C_2$-$C_{10}$) alkoxyalkyl group, $C_1$-$C_{20}$ (preferably $C_1$-$C_{10}$) mercaptoalkyl group or $C_2$-$C_{20}$ (preferably $C_2$-$C_{10}$) alkylthioalkyl group.

The synthesis of a polymer may be carried out by standard radical polymerization techniques using well-known chain transfer agents except that the specific chain transfer agent is used. One exemplary procedure is by dissolving monomers including acetoxystyrene, substituted styrenes such as methoxystyrene and chlorostyrene, indene, and acenaphthylene in a solvent, adding a sulfur compound serving as a chain transfer agent and a radical polymerization initiator thereto to form a homogeneous solution, and adding dropwise the solution to a reactor filled with the solvent where a polymer is formed. The polymer is then treated with a base in an organic solvent for deprotection of the acyl group, obtaining a copolymer of multiple components including hydroxystyrene and substituted styrene as well as indene and acenaphthylene.

Examples of the organic solvent used for polymerization include toluene, benzene, tetrahydrofuran, diethyl ether, and dioxane. The organic solvent is typically used in an amount of 1 to 20 parts by weight per 1 part by weight of the total weight of the monomers used in the reaction.

The chain transfer agent used herein is a thiol of formula (20). Exemplary thiol compounds include alkylthiols such as methanethiol, ethanethiol, propanethiol, and butanethiol; hydroxyalkylthiols such as 2-mercaptoethanol, 3-mercapto-1-propanol, and 4-mercapto-1-butanol; alkoxyalkylthiols such as 2-methoxy-1-ethanethiol, 3-methoxy-1-propanethiol, 2-(2-methoxyethoxy)ethanethiol, and 2-(2-ethoxyethoxy)ethanethiol; alkylthioalkylthiols such as methylthiomethanethiol, methylthioethanethiol, ethylthiomethanethiol, and ethylthioethanethiol; and dithiols such as 1,2-ethanedithiol, 1,3-propanedithiol, and 1,4-butanedithiol. The chain transfer agent is typically used in an amount of 0.1 to 20 mol %, preferably 1 to 10 mol % based on the total moles of the monomers used in the reaction.

Suitable polymerization initiators include 2,2'-azobisisobutyronitrile, 2,2'-azobis(2,4-dimethylvaleronitrile), dimethyl 2,2-azobis(2-methylpropionate), benzoyl peroxide, and lauroyl peroxide. The polymerization initiator is typically used in an amount of 0.5 to 25 mol % based on the total moles of the monomers used in the reaction.

The polymerization reaction is preferably performed at a temperature of 40 to 80° C. The reaction time is preferably 2 to 100 hours, more preferably 5 to 40 hours. With respect to the deprotection of acyl group, examples of the base include aqueous ammonia, triethylamine, and 2-ethanolamine, the reaction temperature is preferably −20° C. to 100° C., more preferably 0° C. to 60° C., and the reaction time is preferably 0.2 to 100 hours, more preferably 0.5 to 40 hours.

Synthesis of the polymer may also be performed by previously protecting the phenolic hydroxyl group with an acyl group, i.e., protective group susceptible to alkaline hydrolysis or an acetal or tertiary alkyl group susceptible to acid hydrolysis, and effecting polymerization, followed by deprotection. Inversely, polymerization may be effected using a monomer having a phenolic hydroxyl group, after which modification reaction such as acylation reaction be effected for adjusting a dissolution rate, obtaining a polymer which is ready for use.

The polymer used in the negative resist composition comprises recurring units having a phenolic hydroxyl group for imparting alkaline solubility (corresponding to hydroxystyrene units, hydroxy-substituted indene units, and hydroxy-substituted acenaphthylene units among the above-exemplified combination examples) and recurring units for controlling a dissolution rate in alkaline developer. At least some of the recurring units for controlling a dissolution rate in alkaline developer preferably have a substituent group X. Since proportions of these recurring units have a strong impact on the resolution and pattern profile of a resist, a copolymerization ratio is optimized after the selection of recurring units is completed.

The base polymer as component (A) should preferably have a weight average molecular weight (Mw) of 1,000 to 2,500 as measured in tetrahydrofuran solvent by gel permeation chromatography (high-performance GPC system HLC-8120 by Tosoh Corp.) versus polystyrene standards. A resist composition comprising a polymer with a Mw of less than 1,000 may be less heat resistant. With a Mw of more than 2,500, a resist pattern after development may have a low resolution or become defective. The Mw should be equal to or less than 2,500 in order to reduce LER.

If the base polymer has a narrow molecular weight distribution, then a possibility that the presence of lower and higher molecular weight fractions causes a foreign matter to be left on the pattern after exposure or to degrade the pattern profile is minimized. The influence of molecular weight and dispersity becomes larger as the pattern rule becomes finer. To obtain a resist composition which is advantageously used to form a fine size pattern, the multi-component copolymer used should preferably have a low dispersity of 1.0 to 2.5, more preferably 1.0 to 1.8. Note that the dispersity is a weight average molecular weight divided by a number average molecular weight, Mw/Mn, and represents a molecular weight distribution.

A crosslinker is typically added to the negative resist composition. As previously described, in some embodiments, the crosslinker may be incorporated in the polymer by suitable means such as by adding epoxy-containing units to the polymer. In most cases, the crosslinker is separately added.

While an acid which is generated by a photoacid generator acts as a catalyst, the crosslinker reacts with the polymer to form crosslinks within the polymer and between polymer molecules for thereby rendering the polymer alkali insoluble. It is typically a compound having a plurality of functional groups capable of electrophilic reaction with aromatic rings or hydroxyl groups in constituent units of the polymer to form bonds therewith. A number of compounds are well known as the crosslinker.

As the crosslinker used herein, any well-known crosslinkers may be applicable. Suitable crosslinkers include alkoxymethylglycolurils and alkoxymethylmelamines. Exemplary of the alkoxymethylglycolurils are tetramethoxymethylglycoluril, 1,3-bismethoxymethyl-4,5-bismethoxyethyleneurea, and bismethoxymethylurea. Exemplary of the alkoxymethylmelamines are hexamethoxymethylmelamine and hexaethoxymethylmelamine.

In the negative resist composition, the crosslinker is preferably added in an amount of 2 to 40 parts, more preferably 5 to 20 parts by weight per 100 parts by weight of the base polymer. The crosslinker may be used alone or in admixture of two or more. In the embodiment wherein the base polymer contains recurring units capable of forming crosslinks by electrophilic reaction, the crosslinker may not be added.

Component (B) is an acid generator. It may generally be any of well-known acid generators commonly used in chemically amplified resist compositions, as described in Patent Document 3, for example.

Suitable photoacid generators include sulfonium salts, iodonium salts, sulfonyldiazomethane and N-sulfonyloxyimide photoacid generators. They may be used alone or in admixture of two or more. These salts or compounds generate sulfonic acids, and examples of the counter anion these sulfonic acids possess include benzenesulfonic acid, toluenesulfonic acid, 4-(4-toluenesulfonyloxy)benzenesulfonic acid, pentafluorobenzenesulfonic acid, 2,2,2-trifluoroethanesulfonic acid, nonafluorobutanesulfonic acid, heptadecafluorooctanesulfonic acid, and camphorsulfonic acid anions.

Although the amount of the acid generator (B) added to the negative resist composition is not particularly limited, it is preferably added in an amount of 0.4 to 20 parts, more preferably 0.8 to 15 parts by weight per 100 parts by weight of the base polymer. While an approach of increasing the amounts of acid generator and basic substance at the same time is expected to enhance a sensitivity and improve a resolution, generally the addition of more than 20 parts by weight of the acid generator may be uneconomical because no further sensitivity enhancement effect is available. If the amount of the acid generator is less than 0.4 part by weight, the amount of basic substance must be reduced in order to meet the required sensitivity, with the risk that a resist pattern is degraded in resolution. Particularly when the resist film is intended for radiation or EB exposure, the energy decay of radiation or beam in the film caused by addition of the acid generator is not problematic, but a high sensitivity is hardly available. In this case, the acid generator is added in a high concentration as compared with the excimer laser light lithography and preferably in an amount of 2.0 to 20 parts by weight.

Of the acid generators mentioned above, the acid generators in the form of triphenylsulfonium benzenesulfonic acid having the general formula (6) are preferred for use in the negative resist composition.

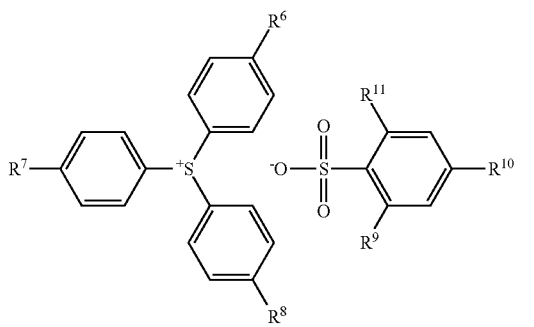

(6)

Herein $R^6$, $R^7$ and $R^8$ are each independently hydrogen or a straight or branched $C_1$-$C_4$ alkyl group, $R^9$, $R^{10}$ and $R^{11}$ are each independently a straight or branched $C_3$-$C_{10}$ alkyl group.

The benzenesulfonic acid moiety which is the counter anion of the acid generator may be adjusted, by a choice of an alkyl group introduced into the benzene nucleus, so as to find an appropriate compromise between the acid diffusion and pattern profile controlling purposes. Acid diffusion is controlled in the order of methyl<ethyl<isopropyl while the sensitivity of resist film is reduced at the same time. Basically, control of acid diffusion tends to improve resolution, but may reduce reactivity.

While controlling acid diffusion is believed effective for reducing undercut, it becomes difficult on account of reduced reactivity to increase the crosslinking density. It is then a common practice to use a mixture of an acid generator having accelerated diffusion 2,4-dimethylbenzenesulfonic acid and an acid generator having controlled diffusion 2,4,6-triisopropylbenzenesulfonic acid.

In the resist composition comprising a polymer containing a thioalkyl group of formula (3) in its chain, however, an acid generator capable of generating a less diffusive acid is effective because the sulfur atom serves to increase the efficiency of acid generation from the photoacid generator. Preferred in this sense are those acid generators which generate 2,4,6-triisopropylbenzenesulfonic acid, 2,4,6-tripropylbenzenesulfonic acid, 2,4,6-tributylbenzenesulfonic acid, 2,4,6-tri-tert-butylbenzenesulfonic acid, 2,4,6-triamylbenzenesulfonic acid, and 2,4,6-triisoamylbenzenesulfonic acid.

Since it is known that an alkyl group introduced into the benzene nucleus of the triphenylsulfonium cation moiety serves to reduce the solubility of a resist film in alkaline developer, the alkaline solubility of resist film can be controlled in terms of the acid generator. When a polymer has a high dissolution rate, an alkyl-substituted triphenylsulfonium acid generator is effective.

Also contained in the resist composition is a basic component (C). It is typically an amine compound having a carboxyl group, but free of hydrogen in covalent bond with nitrogen serving as basic center. Inclusion of the basic component prevents the occurrence of undercuts and solves the bridge problem, when a base polymer having introduced therein recurring units having an electron donative group as represented by formula (2) is used, and also enables to form a fine pattern with a size of less than 50 nm when a resist film having a thickness of less than 100 nm is used.

By contrast, an amine compound having a carboxyl group and hydrogen in covalent bond with nitrogen serving as basic center, like a primary amine, does not exert the effect of mitigating undercuts on the substrate. To maximize the effect, a tertiary amine free of hydrogen in covalent bond with nitrogen serving as basic center is preferred.

Meanwhile, an amine compound in which the basic center is nitrogen contained in an aromatic ring, such as 2-quinolinecarboxylic acid or nicotinic acid is free of hydrogen in covalent bond with nitrogen serving as the basic center. However, since it is a weak base, the carboxyl group does not well orient on the substrate side. Then this amine compound fails to prevent the acid generated from diffusing to the substrate and eventually being deactivated.

The undercut problem often arises on substrates whose surface material is a nitride compound such as TiN, SiN or SiON. This is true particularly when the substrate surface is of a metal chromium-based compound, which may be either metal chromium or a chromium compound containing nitrogen and/or oxygen, and at worse, it is difficult to overcome the undercut problem in this situation. By contrast, the resist composition of the invention enables to form a pattern of satisfactory profile even on a substrate whose outermost surface is of a chromium-based compound. Thus it is advantageously used in processing of photomask blanks and the like.

With respect to the chemical structure of the amine compound having a carboxyl group, but free of hydrogen in covalent bond with nitrogen serving as basic center, preferred examples include amine compounds of the general formulae (7) to (9), but are not limited thereto.

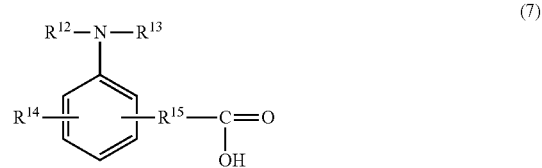

(7)

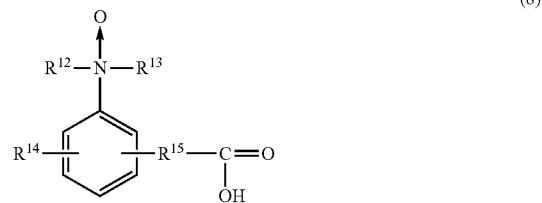

(8)

(9)

Herein $R^{12}$ and $R^{13}$ are each independently a straight, branched or cyclic $C_1$-$C_{20}$ alkyl group, $C_6$-$C_{20}$ aryl group, $C_7$-$C_{20}$ aralkyl group, $C_2$-$C_{20}$ hydroxyalkyl group, $C_2$-$C_{20}$ alkoxyalkyl group, $C_2$-$C_{20}$ acyloxyalkyl group, or $C_2$-$C_{20}$ alkylthioalkyl group, or $R^{12}$ and $R^{13}$ may bond together to form a ring structure or aromatic ring with the nitrogen atom to which they are attached. $R^{14}$ is hydrogen, a straight, branched or cyclic $C_1$-$C_{20}$ alkyl group, $C_6$-$C_{20}$ aryl group, $C_7$-$C_{20}$ aralkyl group, $C_2$-$C_{20}$ hydroxyalkyl group, $C_2$-$C_{20}$ alkoxyalkyl group, $C_2$-$C_{20}$ acyloxyalkyl group, $C_2$-$C_{20}$ alkylthioalkyl group, or halogen. $R^{15}$ is a single bond, a straight, branched or cyclic $C_1$-$C_{20}$ alkylene group, or $C_6$-$C_{20}$ arylene group. $R^{16}$ is an optionally substituted, straight or branched $C_2$-$C_{20}$ alkylene group whose carbon-carbon linkage may be separated by at least one carbonyl (—CO—), ether (—O—), ester (—COO—) or sulfide (—S—) group. $R^{17}$ is a straight, branched or cyclic $C_1$-$C_{20}$ alkylene group or $C_6$-$C_{20}$ arylene group.

Exemplary groups in these structural formulae are given below, but not limited thereto. Suitable $C_6$-$C_{20}$ aryl groups include phenyl, naphthyl, anthryl, phenanthryl, pyrenyl, naphthacenyl, and fluorenyl. Suitable straight, branched or cyclic $C_1$-$C_{20}$ alkyl groups include methyl, ethyl, propyl, isopropyl, butyl, isobutyl, t-butyl, pentyl, hexyl, decyl, cyclopentyl, cyclohexyl, and decahydronaphthalenyl. Suitable $C_2$-$C_{20}$ aralkyl groups include benzyl, phenethyl, phenylpropyl, naphthylmethyl, naphthylethyl, and anthracenylmethyl. Suitable $C_2$-$C_{20}$ (preferably $C_2$-$C_{10}$) hydroxyalkyl groups include hydroxymethyl, hydroxyethyl, and hydroxypropyl. Suitable $C_2$-$C_{20}$ (preferably $C_2$-$C_{10}$) alkoxyalkyl groups include methoxymethyl, ethoxymethyl, propoxymethyl, isopropoxymethyl, butoxymethyl, isobutoxymethyl, t-butoxymethyl, t-amyloxymethyl, cyclohexyloxymethyl, and cyclopentyloxymethyl. Suitable $C_2$-$C_{20}$ (preferably $C_2$-$C_{10}$) acyloxyalkyl groups include formyloxymethyl, acetoxymethyl, propionyloxymethyl, butyryloxymethyl, pivaloyloxymethyl, cyclohexanecarbonyloxymethyl, and decanoyloxymethyl. Suitable $C_2$-$C_{20}$ (preferably $C_2$-$C_{10}$) alkylthioalkyl groups include methylthiomethyl, ethylthiomethyl, propylthiomethyl, isopropylthiomethyl, butylthiomethyl, isobutylthiomethyl, t-butylthiomethyl, t-amylthiomethyl, decylthiomethyl, and cyclohexylthiomethyl.

Preferred examples of the amine compound of formula (7) include, but are not limited thereto, o-dimethylaminobenzoic acid, p-dimethylaminobenzoic acid, m-dimethylaminobenzoic acid, p-diethylaminobenzoic acid, p-dipropylaminobenzoic acid, p-diisopropylaminobenzoic acid, p-dibutylaminobenzoic acid, p-dipentylaminobenzoic acid, p-dihexylaminobenzoic acid, p-diethanolaminobenzoic acid, p-diisopropanolaminobenzoic acid, p-dimethanolaminobenzoic acid, 2-methyl-4-diethylaminobenzoic acid, 2-methoxy-4-diethylaminobenzoic acid, 3-dimethylamino-2-naphthalenic acid, 3-diethylamino-2-naphthalenic acid, 2-dimethylamino-5-bromobenzoic acid, 2-dimethylamino-5-chlorobenzoic acid, 2-dimethylamino-5-iodobenzoic acid, 2-dimethylamino-5-hydroxybenzoic acid, 4-dimethylaminophenylacetic acid, 4-dimethylaminophenylpropionic acid, 4-dimethylaminophenylbutyric acid, 4-dimethylaminophenylmalic acid, 4-dimethylaminophenylpyruvic acid, 4-dimethylaminophenyllacetic acid, 2-(4-dimethylaminophenyl) benzoic acid, and 2-(4-(dibutylamino)-2-hydroxybenzoyl) benzoic acid.

Preferred examples of the amine oxide compound of formula (8) include oxidized forms of exemplary compounds of formula (7), but are not limited thereto.

Preferred examples of the amine compound of formula (9) include, but are not limited thereto, 1-piperidinepropionic acid, 1-piperidinebutyric acid, 1-piperidinemalic acid, 1-piperidinepyruvic acid, and 1-piperidinelactic acid.

The compound having an amine oxide structure represented by formula (8) may be prepared by selecting an optimum method in accordance with a particular structure. Exemplary non-limiting methods include oxidizing reaction of a nitrogen-containing compound using an oxidizing agent and oxidizing reaction of a nitrogen-containing compound in a hydrogen peroxide water diluted solution. These methods are described below in detail.

One exemplary method for preparing an amine oxide compound containing a carboxyl group, but not hydrogen in covalent bond with nitrogen serving as basic center within the molecule is shown below. This method is applicable to the synthesis of a compound of formula (8).

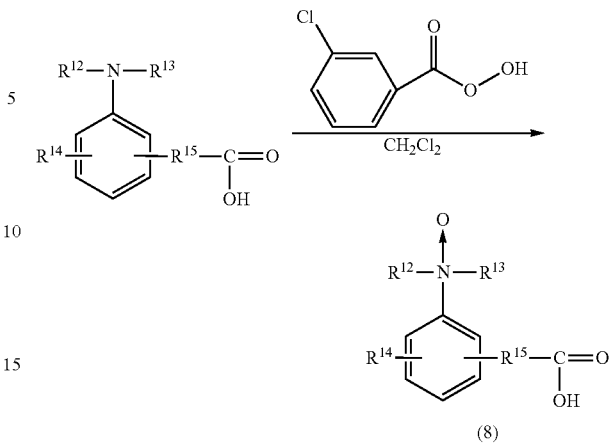

(8)

This reaction is an oxidizing reaction of an amine using an oxidizing agent, m-chloroperbenzoic acid. The reaction may be performed using other oxidizing agents commonly employed in standard oxidizing reaction. Following the reaction, the reaction mixture may be purified by standard techniques such as distillation, chromatography and recrystallization.

The amine compound containing a carboxyl group, but not hydrogen in covalent bond with nitrogen serving as basic center within the molecule is expected to behave such that the presence of a functional group substituting on the nitrogen atom enables quick capture of the acid generated, while the carboxyl group is oriented on the substrate side. These functions cooperate to prevent the acid generated from diffusing toward the substrate and eventually being deactivated. As a result, a photoresist composition comprising an amine compound having a carboxyl group displays a high resolution and forms a pattern profile having improved perpendicularity at the interface with the substrate. Then a pattern of better profile can be formed by selecting an amine compound containing a carboxyl group, but not hydrogen in covalent bond with nitrogen serving as basic center so as to meet the desired physical properties such as volatility, basicity, acid capture rate, and diffusion rate in resist film, and adjusting its amount in accordance with a particular base polymer and acid generator to be combined with it.

Also the amine compound containing a carboxyl group, but not hydrogen in covalent bond with nitrogen serving as basic center within the molecule has the undercut profile-controlling effect that is accounted for by the orientation of carboxyl group toward the substrate. Then to obtain the effect, it is not always necessary that all basic substances added be an amine compound containing a carboxyl group, but not hydrogen in covalent bond with nitrogen serving as basic center within the molecule. That is, the amine compound containing a carboxyl group, but not hydrogen in covalent bond with nitrogen serving as basic center within the molecule may be used in combination with a common basic component other than that amine compound. Notably, the working mechanism described above is presumed from the results, and the patentability of the invention does not depend on whether the presumption is right or wrong.

In general, the other amine compounds which can be used herein include a multiplicity of well-known basic components commonly used in chemically amplified resist compositions, as described in Patent Document 3, for example. Examples include primary, secondary, and tertiary aliphatic amines, mixed amines, aromatic amines, heterocyclic amines, nitrogen-containing compounds having carboxyl group, nitrogen-containing compounds having sulfonyl group, nitrogen-containing compounds having hydroxyl group, nitrogen-containing compounds having hydroxyphenyl group, alcoholic nitrogen-containing compounds, amide derivatives, and imide derivatives, as described in Patent Document 3.

In particular, amine or amine oxide compounds having the following general formula (10) or (11) are useful for combination.

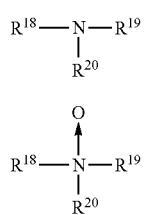

Herein $R^{18}$, $R^{19}$ and $R^{20}$ are each independently hydrogen, a straight, branched or cyclic $C_1$-$C_{20}$ alkyl group, $C_6$-$C_{20}$ aryl group, $C_7$-$C_{20}$ aralkyl group, $C_2$-$C_{10}$ hydroxyalkyl group, $C_2$-$C_{10}$ alkoxyalkyl group, $C_3$-$C_{10}$ acyloxyalkyl group, or $C_1$-$C_{10}$ alkylthioalkyl group, any two of $R^{18}$, $R^{19}$ and $R^{20}$ may bond together to form a ring structure or aromatic ring with the nitrogen atom to which they are attached.

In the embodiment wherein the amine compound containing a carboxyl group, but not hydrogen in covalent bond with nitrogen serving as basic center is used in admixture with a common amine compound, the amine or amine oxide compound containing a carboxyl group, but not active hydrogen and the other amine or amine oxide compound are preferably blended in a weight ratio of from 100:0 to 10:90, and more preferably from 100:0 to 30:70.

With respect to the addition of the basic component, the foregoing amine compounds may be used alone or in admixture of two or more, preferably in a (total) amount of 0.01 to 2 parts, more preferably 0.01 to 1 parts by weight per 100 parts by weight of the base polymer. A less amount may fail to achieve the addition effect whereas an amount of more than 2 parts may lead to a lowering of sensitivity.

An organic solvent is used in the preparation of the resist composition. It may be any of organic solvents in which the base polymer, acid generator and other additives are dissolvable. Suitable organic solvents include, but are not limited to, ketones such as cyclohexanone and methyl n-amyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone. These solvents may be used alone or in admixture. Of these solvents, ethyl lactate, propylene glycol monomethyl ether, PGMEA, and mixtures thereof are preferred because the acid generator is most soluble therein.

In the negative resist composition, the organic solvent is preferably used in an amount of 1,000 to 10,000 parts by weight, more preferably 2,000 to 9,700 parts by weight per 100 parts by weight of the base polymer. When adjusted to such a concentration, the resist composition is applicable by a spin coating technique to form a resist film having a thickness of 10 to 100 nm and an improved flatness in a consistent manner.

To the resist composition, a surfactant may be added as optional component (D) for improving coating characteristics. Illustrative, non-limiting, examples of the surfactant include nonionic surfactants, for example, polyoxyethylene alkyl ethers such as polyoxyethylene lauryl ether, polyoxyethylene stearyl ether, polyoxyethylene cetyl ether, and polyoxyethylene oleyl ether, polyoxyethylene alkylaryl ethers such as polyoxyethylene octylphenol ether and polyoxyethylene nonylphenol ether, polyoxyethylene polyoxypropylene block copolymers, sorbitan fatty acid esters such as sorbitan monolaurate, sorbitan monopalmitate, and sorbitan monostearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorochemical surfactants such as EFTOP EF301, EF303 and EF352 (Jemco Co., Ltd.), Megaface F171, F172, F173, R08, R30, R90 and R94 (DIC Corp.), Fluorad FC-430, FC-431, FC-4430, and FC-4432 (Sumitomo 3M Co., Ltd.), Asahiguard AG710, Surflon S-381, S-382, S-386, SC101, SC102, SC103, SC104, SC105, SC106, KH-10, KH-20, KH-30 and KH-40 (Asahi Glass Co., Ltd.), Surfynol E1004 (Nisshin Chemical Co., Ltd.); organosiloxane polymers KP341, X-70-092 and X-70-093 (Shin-Etsu Chemical Co., Ltd.), acrylic acid or methacrylic acid Polyflow No. 75 and No. 95 (Kyoeisha Ushi Kagaku Kogyo K.K.). A copolymer resulting from ring-opening polymerization of fluorinated oxetane compound is also useful as the surfactant because it has little impact on the coating characteristics of resist even when the addition amount varies. A typical copolymer is PF-636 from Omnova Solutions, Inc. These surfactants may be used alone or in admixture.

In the chemically amplified negative resist composition, the surfactant is preferably formulated in an amount of up to 2 parts, and more preferably up to 1 part by weight, per 100 parts by weight of the base polymer.

Process

The resist composition formulated as above is used to form a resist film on a processable substrate (or substrate to be processed). The process includes the steps of coating the resist composition onto the processable substrate and prebaking. These steps may be performed by well-known techniques. Depending on a particular purpose, a resist film having a thickness in the range of 10 to 100 nm may be formed. The coating step may be performed by spin coating and several other known techniques. Where a resist film having a thickness of 10 to 100 nm is formed, spin coating is preferred to achieve a uniform film thickness.

Where the processable substrate is a semiconductor wafer, spin coating conditions must be adjusted in accordance with the wafer size, the desired film thickness, the composition of resist, and the like. In an example wherein a resist film having a thickness of about 100 nm is formed on a 8-inch wafer, the resist composition is cast on the wafer, after which the wafer is spun at 4,000 to 5,000 rpm for 40 seconds. Then a resist film featuring uniformity is obtained. In this example, the amount of the solvent used in the preparation of the resist composition is preferably 1,400 to 1,600 parts by weight per 100 parts by weight of the base polymer. The resist coating thus applied is then prebaked in order to remove the excess solvent remaining in the coating. The prebaking is preferably performed, for example, on a hot plate at a temperature of 80 to 130° C. for 1 to 10 minutes, more preferably at 90 to 110° C. for 3 to 5 minutes.

Where the processable substrate is a photomask blank, coating conditions must also be adjusted in accordance with the blank size, the desired film thickness, the composition of resist, and the like. In an example wherein a resist film having a thickness of about 100 nm is formed on a square blank of 15.2 cm×15.2 cm, the resist composition is cast on the blank, after which the blank is spun at 1,000 to 3,000 rpm for 2 seconds and then at or below 800 rpm for 30 seconds. Then a resist film featuring uniformity is obtained. In this example, the amount of the solvent used in the preparation of the resist composition is preferably 2,000 to 9,700 parts by weight per 100 parts by weight of the base polymer. The resist coating thus applied is then prebaked in order to remove the excess solvent remaining in the coating. The prebaking is preferably performed, for example, on a hot plate at a temperature of 80 to 130° C. for 4 to 20 minutes, more preferably at 90 to 110° C. for 8 to 12 minutes.

Next, the resist film thus formed is subjected to patternwise exposure to form the desired pattern. In the case of semiconductor processing, exposure may be performed by placing a mask having the desired pattern over the resist film, and irradiating high-energy radiation (e.g., deep UV, excimer laser or x-ray) or electron beam (EB) so as to give an exposure dose of 1 to 100 $\mu C/cm^2$, preferably 10 to 100 $\mu C/cm^2$. The exposure may be performed by standard lithography or if desired, by immersion lithography of filling a liquid between the projection lens and the resist film.

Where a photomask blank is processed, the patternwise exposure is generally beam exposure because this processing does not aim to produce a number of identical parts. The high-energy radiation used herein is typically electron beam although any radiation from other light sources may be similarly used as long as the radiation is collected into a beam.

Following the exposure, the resist film is typically baked in order to cause the acid to diffuse to induce chemical amplifying reaction. The post-exposure baking (PEB) is preferably performed, for example, on a hot plate at a temperature of 60 to 150° C. for 0.1 to 5 minutes, more preferably at 80 to 140° C. for 0.5 to 3 minutes. The resist film is then developed with a developer in the form of an aqueous alkaline solution, typically a 0.1 to 5 wt %, preferably 2 to 3 wt % aqueous solution of tetramethylammonium hydroxide (TMAH) for 0.1 to 3 minutes, preferably 0.5 to 2 minutes by a standard technique such as dip, puddle or spray technique. In this way, the desired pattern is formed on the substrate. The development may be followed by further heat treatment (known as thermal flow) for regulating the pattern size. The negative resist composition and the pattern forming process are best suited in nano-scale patterning using selected high-energy radiation such as deep-UV or excimer laser having a wavelength 250 to 120 nm, EUV, x-ray or EB.

Examples of the processable substrate amenable to the lithography by which the pattern forming process using the negative resist composition is implemented include semiconductor wafers and intermediate substrates for use in the fabrication of semiconductor devices, and photomask substrates. Better results are obtained when the invention is applied to a substrate having a layer of metal compound deposited by sputtering or the like. The advantages of the invention become more outstanding particularly when applied to a photomask blank comprising a chromium compound film deposited at the outermost surface as the light-shielding film or etch mask film, because it is otherwise difficult to control the profile of a resist pattern at the substrate interface. Exemplary chromium compounds used as the substrate outermost surface material to which the invention is advantageously applicable include metallic chromium, chromium oxide, chromium nitride, chromium carbide, chromium oxynitride, chromium oxycarbide, chromium nitride carbide, and chromium oxide nitride carbide.

EXAMPLE

Synthesis Examples, Comparative Synthesis Examples, Examples, and Comparative Examples are given below by way of illustration and not by way of limitation. The average molecular weights including weight average molecular weight (Mw) and number average molecular weight (Mn) are determined by gel permeation chromatography (GPC) versus polystyrene standards, from which a dispersity (Mw/Mn) is computed. The polymerization initiator used is dimethyl 2,2'-azobis(2-methylpropionate) available under the trade name V601 from Wako Wako Pure Chemical Industries, Ltd.

Synthesis Example 1

In a 500-mL dropping funnel under nitrogen blanket, a solution was prepared by adding 102.5 g of 4-acetoxystyrene, 13.1 g of 4-chlorostyrene, 84.4 g of indene, 26.8 g of dimethyl 2,2'-azobis(2-methylpropionate) (V601), 5.7 g of 2-mercaptoethanol as a chain transfer agent, and 185 g of toluene as a solvent. A 2-L polymerization flask was purged with nitrogen, charged with 185 g of toluene, and heated at 80° C., after which the solution was added dropwise to the flask over 4 hours. After the completion of dropwise addition, stirring was continued for 18 hours while maintaining the polymerization temperature of 80° C. The polymerization solution was then cooled down to room temperature and added dropwise to 3,200 g of hexane whereupon a copolymer precipitated. The copolymer precipitate was collected by filtration and washed twice with 600 g of a 10:1 mixture of hexane and toluene. In a nitrogen atmosphere, the copolymer was dissolved in 360 g of tetrahydrofuran and 120 g of methanol in a 1-L flask, 38.6 g of ethanolamine was added, and the contents were stirred at 60° C. for 2.5 hours. The reaction solution was concentrated in vacuum, and the concentrate was dissolved in 600 g of ethyl acetate. The solution was transferred to a separatory funnel where it was combined with 180 g of water and 12.9 g of acetic acid, followed by separatory operation. After the lower layer was removed, 180 g of water and 17.2 g of pyridine were added to the organic layer, followed by separatory operation. After the lower layer was removed, 180 g of water was added to the organic layer, followed by washing and separatory operation, which was repeated 5 times in total. Phase separation could be facilitated by adding 50 g of acetone and stirring for some time during the standing stage in every separatory operation.

The organic layer following the separatory operation was concentrated and dissolved in 300 g of acetone. The acetone solution was passed through a nylon filter with a pore size of 0.02 μm and added dropwise to 5,000 g of water for precipitation. The precipitate was filtered, water washed, and dried, yielding 85.0 g of a white polymer. The polymer, designated Polymer-1, was analyzed by $^{13}C$-NMR, $^1H$-NMR, and GPC, with the results shown below.

Copolymerization compositional ratio (molar basis) 4-hydroxystyrene:4-chlorostyrene:indene:2-mercaptoethanol=62.8:17.2:15.5:4.5
Mw=1,600
Mw/Mn=1.71

Synthesis Example 2

A polymer was synthesized by the same procedure as in Synthesis Example 1 except that 6.5 g of 1-butanethiol was used instead of the 2-mercaptoethanol. The polymer, designated Polymer-2, was analyzed by $^{13}$C-NMR, $^1$H-NMR, and GPC, with the results shown below.

Copolymerization compositional ratio (molar basis) 4-hydroxystyrene:4-chlorostyrene:indene:1-butanethiol=63.0:17.0:15.5:4.5
Mw=1,550
Mw/Mn=1.73

Synthesis Example 3

In a 500-mL dropping funnel under nitrogen blanket, a solution was prepared by adding 101.8 g of 4-acetoxystyrene, 11.8 g of 4-methoxystyrene, 86.4 g of indene, 26.9 g of dimethyl 2,2'-azobis(2-methylpropionate) (V601), 5.7 g of 2-mercaptoethanol as a chain transfer agent, and 185 g of toluene as a solvent. A 2-L polymerization flask was purged with nitrogen, charged with 185 g of toluene, and heated at 80° C., after which the solution was added dropwise to the flask over 4 hours. After the completion of dropwise addition, stirring was continued for 18 hours while maintaining the polymerization temperature of 80° C. The polymerization solution was then cooled down to room temperature and added dropwise to 3,200 g of hexane whereupon a copolymer precipitated. The copolymer precipitate was collected by filtration and washed twice with 600 g of a 10:1 mixture of hexane and toluene. In a nitrogen atmosphere, the copolymer was dissolved in 360 g of tetrahydrofuran and 120 g of methanol in a 1-L flask, 38.3 g of ethanolamine was added, and the contents were stirred at 60° C. for 2.5 hours. The reaction solution was concentrated in vacuum, and the concentrate was dissolved in 600 g of ethyl acetate. The solution was transferred to a separatory funnel where it was combined with 180 g of water and 12.8 g of acetic acid, followed by separatory operation. After the lower layer was removed, 180 g of water and 16.8 g of pyridine were added to the organic layer, followed by separatory operation. After the lower layer was removed, 180 g of water was added to the organic layer, followed by washing and separatory operation, which was repeated 5 times in total. Phase separation could be facilitated by adding 50 g of acetone and stirring for some time during the standing stage in every separatory operation.

The organic layer following the separatory operation was concentrated and dissolved in 300 g of acetone. The acetone solution was passed through a nylon filter with a pore size of 0.02 μm and added dropwise to 5,000 g of water for precipitation. The precipitate was filtered, water washed, and dried, yielding 83.0 g of a white polymer. The polymer, designated Polymer-3, was analyzed by $^{13}$C-NMR, $^1$H-NMR, and GPC, with the results shown below.

Copolymerization compositional ratio (molar basis) 4-hydroxystyrene:4-methoxystyrene:indene:2-mercaptoethanol=62.7:16.6:16.2:4.5
Mw=1,650
Mw/Mn=1.74

Synthesis Example 4

A polymer was synthesized by the same procedure as in Synthesis Example 3 except that 6.5 g of 1-butanethiol was used instead of the 2-mercaptoethanol. The polymer, designated Polymer-4, was analyzed by $^{13}$C-NMR, $^1$H-NMR, and GPC, with the results shown below.

Copolymerization compositional ratio (molar basis) 4-hydroxystyrene:4-methoxystyrene:indene:1-butanethiol=61.9:17.1:16.6:4.4
Mw=1,550
Mw/Mn=1.72

Synthesis Example 5

In a 500-mL dropping funnel under nitrogen blanket, a solution was prepared by adding 134.9 g of 4-acetoxystyrene, 31.9 g of 4-chlorostyrene, 33.2 g of acenaphthylene, 23.6 g of dimethyl 2,2'-azobis(2-methylpropionate) (V601), 5.0 g of 2-mercaptoethanol as a chain transfer agent, and 185 g of toluene as a solvent. A 2-L polymerization flask was purged with nitrogen, charged with 185 g of toluene, and heated at 80° C., after which the solution was added dropwise to the flask over 4 hours. After the completion of dropwise addition, stirring was continued for 18 hours while maintaining the polymerization temperature of 80° C. The polymerization solution was then cooled down to room temperature and added dropwise to 3,200 g of hexane whereupon a copolymer precipitated. The copolymer precipitate was collected by filtration and washed twice with 600 g of a 10:1 mixture of hexane and toluene. In a nitrogen atmosphere, the copolymer was dissolved in 360 g of tetrahydrofuran and 120 g of methanol in a 1-L flask, 50.8 g of ethanolamine was added, and the contents were stirred at 60° C. for 2.5 hours. The reaction solution was concentrated in vacuum, and the concentrate was dissolved in 600 g of ethyl acetate. The solution was transferred to a separatory funnel where it was combined with 180 g of water and 25.4 g of acetic acid, followed by separatory operation. After the lower layer was removed, 180 g of water and 34.0 g of pyridine were added to the organic layer, followed by separatory operation. After the lower layer was removed, 180 g of water was added to the organic layer, followed by washing and separatory operation, which was repeated 5 times in total. Phase separation could be facilitated by adding 50 g of acetone and stirring for some time during the standing stage in every separatory operation.

The organic layer following the separatory operation was concentrated and dissolved in 300 g of acetone. The acetone solution was passed through a nylon filter with a pore size of 0.02 μm and added dropwise to 5,000 g of water for precipitation. The precipitate was filtered, water washed, and dried, yielding 141.0 g of a white polymer. The polymer, designated Polymer-5, was analyzed by $^{13}$C-NMR, $^1$H-NMR, and GPC, with the results shown below.

Copolymerization compositional ratio (molar basis) 4-hydroxystyrene:4-chlorostyrene:acenaphthylene:2-mercaptoethanol=62.2:17.2:16.1:4.5
Mw=1,450
Mw/Mn=1.76

Synthesis Example 6

A polymer was synthesized by the same procedure as in Synthesis Example 5 except that 5.8 g of 1-butanethiol was used instead of the 2-mercaptoethanol. The polymer, designated Polymer-6, was analyzed by $^{13}$C-NMR, $^1$H-NMR, and GPC, with the results shown below.

Copolymerization compositional ratio (molar basis) 4-hydroxystyrene:4-chlorostyrene:acenaphthylene:1-butanethiol=63.5:16.2:15.7:4.6
Mw=1,500
Mw/Mn=1.72

Synthesis Example 7

In a 500-mL dropping funnel under nitrogen blanket, a solution was prepared by adding 135.6 g of 4-acetoxystyrene, 31.1 g of 4-methoxystyrene, 33.3 g of acenaphthylene, 23.7 g of dimethyl 2,2'-azobis(2-methylpropionate) (V601), 5.0 g of 2-mercaptoethanol as a chain transfer agent, and 185 g of toluene as a solvent. A 2-L polymerization flask was purged with nitrogen, charged with 185 g of toluene, and heated at 80° C., after which the solution was added dropwise to the flask over 4 hours. After the completion of dropwise addition, stirring was continued for 18 hours while maintaining the polymerization temperature of 80° C. The polymerization solution was then cooled down to room temperature and added dropwise to 3,200 g of hexane whereupon a copolymer precipitated. The copolymer precipitate was collected by filtration and washed twice with 600 g of a 10:1 mixture of hexane and toluene. In a nitrogen atmosphere, the copolymer was dissolved in 360 g of tetrahydrofuran and 120 g of methanol in a 1-L flask, 51.1 g of ethanolamine was added, and the contents were stirred at 60° C. for 2.5 hours. The reaction solution was concentrated in vacuum, and the concentrate was dissolved in 600 g of ethyl acetate. The solution was transferred to a separatory funnel where it was combined with 180 g of water and 25.5 g of acetic acid, followed by separatory operation. After the lower layer was removed, 180 g of water and 34.0 g of pyridine were added to the organic layer, followed by separatory operation. After the lower layer was removed, 180 g of water was added to the organic layer, followed by washing and separatory operation, which was repeated 5 times in total. Phase separation could be facilitated by adding 50 g of acetone and stirring for some time during the standing stage in every separatory operation.

The organic layer following the separatory operation was concentrated and dissolved in 300 g of acetone. The acetone solution was passed through a nylon filter with a pore size of 0.02 μm and added dropwise to 5,000 g of water for precipitation. The precipitate was filtered, water washed, and dried, yielding 141.0 g of a white polymer. The polymer, designated Polymer-7, was analyzed by $^{13}$C-NMR, $^1$H-NMR, and GPC, with the results shown below.

Copolymerization compositional ratio (molar basis) 4-hydroxystyrene:4-methoxystyrene:acenaphthylene:2-mercaptoethanol=62.0:17.6:15.9:4.5
Mw=1,550
Mw/Mn=1.74

Synthesis Example 8

A polymer was synthesized by the same procedure as in Synthesis Example 7 except that 5.8 g of 1-butanethiol was used instead of the 2-mercaptoethanol. The polymer, designated Polymer-8, was analyzed by $^{13}$C-NMR, $^1$H-NMR, and GPC, with the results shown below.

Copolymerization compositional ratio (molar basis) 4-hydroxystyrene:4-methoxystyrene:acenaphthylene:1-butanethiol=62.3:17.3:15.9:4.5
Mw=1,650
Mw/Mn=1.75

Synthesis Example 9

In a 500-mL dropping funnel under nitrogen blanket, a solution was prepared by adding 138.5 g of 4-hydroxyphenyl methacrylate, 27.7 g of 4-methoxystyrene, 33.8 g of acenaphthylene, 23.9 g of dimethyl 2,2'-azobis(2-methyl-propionate) (V601), 4.8 g of 2-mercaptoethanol as a chain transfer agent, and 185 g of toluene as a solvent. A 2-L polymerization flask was purged with nitrogen, charged with 185 g of toluene, and heated at 80° C., after which the solution was added dropwise to the flask over 4 hours. After the completion of dropwise addition, stirring was continued for 18 hours while maintaining the polymerization temperature of 80° C. The polymerization solution was then cooled down to room temperature and added dropwise to 3,200 g of hexane whereupon a copolymer precipitated. The copolymer precipitate was collected by filtration and washed twice with 600 g of a 10:1 mixture of hexane and toluene, obtaining 198.2 g of a white polymer. The polymer, designated Polymer-9, was analyzed by $^{13}$C-NMR, $^1$H-NMR, and GPC, with the results shown below.

Copolymerization compositional ratio (molar basis) 4-hydroxyphenyl methacrylate:4-methoxystyrene:acenaphthylene:2-mercaptoethanol=63.1:16.4:15.8:4.7
Mw=1,700
Mw/Mn=1.82

Synthesis Example 10

A polymer was synthesized by the same procedure as in Synthesis Example 9 except that 5.8 g of 1-butanethiol was used instead of the 2-mercaptoethanol. The polymer, designated Polymer-10, was analyzed by $^{13}$C-NMR, $^1$H-NMR, and GPC, with the results shown below.

Copolymerization compositional ratio (molar basis) 4-hydroxyphenyl methacrylate:4-methoxystyrene:acenaphthylene:1-butanethiol=62.4:17.2:15.9:4.5
Mw=1,700
Mw/Mn=1.72

Comparative Synthesis Example 1

In a 500-mL dropping funnel under nitrogen blanket, a solution was prepared by adding 150.3 g of 4-acetoxystyrene, 24.6 g of 4-chlorostyrene, 25.1 g of acenaphthylene, 23.4 g of dimethyl 2,2'-azobis(2-methylpropionate) (V601), and 185 g of toluene as a solvent. A 2-L polymerization flask was purged with nitrogen, charged with 185 g of toluene, and heated at 80° C., after which the solution was added dropwise to the flask over 4 hours. After the completion of dropwise addition, stirring was continued for 18 hours while maintaining the polymerization temperature of 80° C. The polymerization solution was then cooled down to room temperature and added dropwise to 3,200 g of hexane whereupon a copolymer precipitated. The copolymer precipitate was collected by filtration and washed twice with 600 g of a 10:1 mixture of hexane and toluene. In a nitrogen atmosphere, the copolymer was dissolved in 360 g of tetrahydrofuran and 120 g of methanol in a 1-L flask, 56.6 g of ethanolamine was added, and the contents were stirred at 60° C. for 2.5 hours. The reaction solution was concentrated in vacuum, and the concentrate was dissolved in 600 g of ethyl acetate. The solution was transferred to a separatory funnel where it was combined with 180 g of water and 28.3 g of acetic acid, followed by separatory operation. After the lower layer was removed, 180 g of water and 37.2 g of pyridine were added to the organic layer, followed by separatory operation. After the lower layer was removed, 180 g of water was added to the organic layer, followed by washing and separatory operation, which was repeated 5 times in total. Phase separation could be facilitated by adding 50 g of acetone and stirring for some time during the standing stage in every separatory operation.

The organic layer following the separatory operation was concentrated and dissolved in 300 g of acetone. The acetone solution was passed through a nylon filter with a pore size of 0.02 μm and added dropwise to 5,000 g of water for precipitation. The precipitate was filtered, water washed, and dried, yielding 141.0 g of a white polymer. The polymer, designated Polymer-11, was analyzed by $^{13}$C-NMR, $^1$H-NMR, and GPC, with the results shown below.

Copolymerization compositional ratio (molar basis) 4-hydroxystyrene:4-chlorostyrene:acenaphthylene=71.6:15.2:13.2
Mw=3,500
Mw/Mn=1.70

Comparative Synthesis Example 2

A polymer was synthesized by the same procedure as in Comparative Synthesis Example 1 except that 23.9 g of 4-methoxystyrene was used instead of 24.6 g of 4-chlorostyrene. The polymer, designated Polymer-12, was analyzed by $^{13}$C-NMR, $^1$H-NMR, and GPC, with the results shown below.

Copolymerization compositional ratio (molar basis) 4-hydroxystyrene:4-methoxystyrene:acenaphthylene=71.5:15.5:13.0
Mw=3,500
Mw/Mn=1.72

Comparative Synthesis Example 3

In a 500-mL dropping funnel under nitrogen blanket, a solution was prepared by adding 165.1 g of 4-hydroxyphenyl methacrylate, 23.9 g of 4-methoxystyrene, 25.1 g of acenaphthylene, 23.9 g of dimethyl 2,2'-azobis(2-methyl-propionate) (V601), and 185 g of toluene as a solvent. A 2-L polymerization flask was purged with nitrogen, charged with 185 g of toluene, and heated at 80° C., after which the solution was added dropwise to the flask over 4 hours. After the completion of dropwise addition, stirring was continued for 18 hours while maintaining the polymerization temperature of 80° C. The polymerization solution was then cooled down to room temperature and added dropwise to 3,200 g of hexane whereupon a copolymer precipitated. The copolymer precipitate was collected by filtration and washed twice with 600 g of a 10:1 mixture of hexane and toluene, obtaining 201.2 g of a white polymer. The polymer, designated Polymer-13, was analyzed by $^{13}$C-NMR, $^1$H-NMR, and GPC, with the results shown below.

Copolymerization compositional ratio (molar basis) 4-hydroxyphenyl methacrylate:4-methoxystyrene:acenaphthylene=64.7:18.0:17.3
Mw=4,100
Mw/Mn=1.72

Examples 1 to 10 and Comparative Examples 1 to 3

The components (polymer, acid generator, quencher, crosslinker, solvent, etc.) used in formulating resist compositions are identified below.
Base polymer: Polymer-1 to 10 in Synthesis Examples 1 to 10
Comparative base polymer:
  Polymer-11 to 13 in Comparative Synthesis Examples 1 to 3
PAG1: triphenylsulfonium 2,4,6-triisopropyl-benzenesulfonate
PAG2: triphenylsulfonium 2,4,6-tri-tert-butyl-benzenesulfonate
Solvent A: propylene glycol monomethyl ether acetate (PGMEA)
Solvent B: ethyl lactate (EL)
An amine compound containing a carboxyl group, but not active hydrogen or an amine compound free of a carboxyl group was used as the quencher.
Quencher 1: p-diethylaminobenzoic acid
Quencher 2: p-dibutylaminobenzoic acid
Quencher 3: p-dibutylaminobenzoic acid-N-oxide
Quencher 4: 1-piperidinepropionic acid
Quencher 5: tris(2-(methoxymethoxy)ethyl)amine
Quencher 6: tris(2-(methoxymethoxy)ethyl)amine-N-oxide
Quencher 7: N-2-(acetoxy)ethyl-imidazole
Crosslinker: tetramethoxymethylglycoluril
Surfactant A: PF-636 (Omnova Solutions, Inc.)

TABLE 1

| Formulation (pbw) | Example | | | | | | |
|---|---|---|---|---|---|---|---|
| | 1 | 2 | 3 | 4 | 5 | 6 | 7 |
| Polymer-1 | 80 | | | | | | |
| Polymer-2 | | 80 | | | | | |
| Polymer-3 | | | 80 | | | | |
| Polymer-4 | | | | 80 | | | |
| Polymer-5 | | | | | 80 | | |
| Polymer-6 | | | | | | 80 | |
| Polymer-7 | | | | | | | 80 |
| Polymer-8 | | | | | | | |
| Polymer-9 | | | | | | | |
| Polymer-10 | | | | | | | |
| Polymer-11 | | | | | | | |
| Polymer-12 | | | | | | | |
| Polymer-13 | | | | | | | |
| PAG-1 | 10 | 10 | 10 | 10 | 10 | 10 | 10 |
| Crosslinker | 8.2 | 8.2 | 8.2 | 8.2 | 8.2 | 8.2 | 8.2 |
| Quencher-1 | 0.1 | 0.1 | 0.1 | 0.1 | 0.1 | 0.1 | 0.1 |
| Quencher-4 | 0.1 | 0.1 | 0.1 | 0.1 | 0.1 | 0.1 | 0.1 |
| Surfactant A | 0.07 | 0.07 | 0.07 | 0.07 | 0.07 | 0.07 | 0.07 |
| Solvent A | 800 | 800 | 800 | 800 | 800 | 800 | 800 |
| Solvent B | 1,800 | 1,800 | 1,800 | 1,800 | 1,800 | 1,800 | 1,800 |

| Formulation (pbw) | Example | | | Comparative Example | | |
|---|---|---|---|---|---|---|
| | 8 | 9 | 10 | 1 | 2 | 3 |
| Polymer-1 | | | | | | |
| Polymer-2 | | | | | | |
| Polymer-3 | | | | | | |

TABLE 1-continued

| | | | | | | |
|---|---|---|---|---|---|---|
| Polymer-4 | | | | | | |
| Polymer-5 | | | | | | |
| Polymer-6 | | | | | | |
| Polymer-7 | | | | | | |
| Polymer-8 | 80 | | | | | |
| Polymer-9 | | 80 | | | | |
| Polymer-10 | | | 80 | | | |
| Polymer-11 | | | | 80 | | |
| Polymer-12 | | | | | 80 | |
| Polymer-13 | | | | | | 80 |
| PAG-1 | 10 | 10 | 10 | 10 | 10 | 10 |
| Crosslinker | 8.2 | 8.2 | 8.2 | 8.2 | 8.2 | 8.2 |
| Quencher-1 | 0.1 | 0.1 | 0.1 | 0.1 | 0.1 | 0.1 |
| Quencher-4 | 0.1 | 0.1 | 0.1 | 0.1 | 0.1 | 0.1 |
| Surfactant A | 0.07 | 0.07 | 0.07 | 0.07 | 0.07 | 0.07 |
| Solvent A | 800 | 800 | 800 | 800 | 800 | 800 |
| Solvent B | 1,800 | 1,800 | 1,800 | 1,800 | 1,800 | 1,800 |

Negative resist compositions were prepared by dissolving the components in the solvent in accordance with the formulation shown in Table 1 where values are expressed in parts by weight (pbw). The resist compositions were filtered through a nylon resin filter with a pore size of 0.04 μm and then spin-coated onto mask blanks of 152 mm square having a chromium oxynitride layer at the outermost surface at 1,700 rpm. The coated mask blanks were baked on a hot plate at 110° C. for 10 minutes to form a resist film of 90 nm thick.

The film thickness was measured by an optical film thickness measurement system NanoSpec (Nanometrics Inc.). Measurement was carried out at 81 in-plane points on the blank substrate excluding an outer rim portion extending 10 mm inward from the blank circumference. From these measurements, an average film thickness and a film thickness range (i.e., the difference between minimum and maximum of film thickness) were determined.

Using an EB exposure tool EBM5000 (NuFLARE Technology Inc., accelerating voltage 50 keV), the resist films were exposed to EB. They were baked (PEB) at 120° C. for 10 minutes, and spray developed with a 2.38 wt % aqueous solution of TMAH, obtaining negative patterns (Examples 1 to 10, Comparative Examples 1 to 3).

The resulting resist patterns were evaluated as follows. The optimum exposure dose (sensitivity Eop) was the exposure dose which provided a 1:1 resolution at the top and bottom of a 200-nm line-and-space pattern. The minimum line width (nm) of a line-and-space pattern which was ascertained separate when processed at the optimum dose was the resolution of a test resist. The profile of the resolved resist pattern was examined by observing a resist cross section under a scanning electron microscope (SEM) to inspect undercuts at the substrate interface. A LER value was determined from SEM measurement of a 100-nm line-and-space pattern.

The resist composition was examined for dry etching resistance by actually etching the patterned resist film in a dry etching instrument TE-8500S by Tokyo Electron, Ltd. and examining the pattern profile through a cross-sectional observation under SEM. A reduction of film thickness after etching is reported in a relative value on the basis that the reduction of film thickness after etching in Example 1 is 1.0. A smaller value indicates a resist film having better etch resistance. The etching conditions are shown below.

Chamber pressure: 0.667 Pa
RIE: 54 W
ICP: 325 W
Gas: (1) $SF_6$ 18 ml/min
(2) $O_2$ 45 ml/min
Time: 50 sec Table 2 reports the test results including resolution, pattern cross-sectional profile, LER, EB sensitivity, and etch resistance.

TABLE 2

| | | Resolution (nm) | Profile | LER | EB sensitivity | Etch resistance (relative film thickness reduction) |
|---|---|---|---|---|---|---|
| Example | 1 | 45 | Good | 4.1 | 8 | 1.0 |
| | 2 | 45 | Good | 4.2 | 8 | 1.0 |
| | 3 | 40 | Good | 4.2 | 7 | 1.0 |
| | 4 | 40 | Good | 4.3 | 7 | 1.0 |
| | 5 | 40 | Good | 4.3 | 8 | 0.9 |
| | 6 | 40 | Good | 4.2 | 8 | 0.9 |
| | 7 | 35 | Good | 3.9 | 7 | 0.9 |
| | 8 | 35 | Good | 3.9 | 7 | 0.9 |
| | 9 | 40 | Good | 4.2 | 7 | 1.0 |
| | 10 | 40 | Good | 4.1 | 7 | 1.0 |
| Comparative Example | 1 | 50 | Good | 6.3 | 19 | 0.9 |
| | 2 | 50 | Good | 6.4 | 17 | 0.9 |
| | 3 | 50 | Good | 6.5 | 20 | 1.0 |

On the basis of the results of Table 2, resolution is first discussed. The resists using polymers synthesized in the absence of a chain transfer agent in Comparative Examples 1 to 3 had a resolution limit of 50 nm. The resists using polymers with a reduced molecular weight in Examples 1 to 10 had a resolution corresponding to a pattern size of 45 nm or less. The resist using a polymer comprising 4-hydroxystyrene, 4-methoxystyrene, and acenaphthylene units displayed a high resolution, that is, a pattern with a size of 35 nm could be resolved. This is probably because the polymer having acenaphthylene units incorporated therein is so robust that the pattern may not be deformed upon development. With respect to the cross-sectional profile of pattern, resists using any polymers could form patterns of rectangular profile without bridges and undercuts.

Next LER is discussed. In comparing Examples 5, 6 with Comparative Example 1, or Examples 7, 8 with Comparative Example 2, or Examples 9, 10 with Comparative Example 3, the polymers consist of the same units, but have different molecular weights. A comparison reveals that Examples 5, 6, or Examples 7, 8, or Examples 9, 10 using low molecular weight polymers display lower values of LER than Comparative Examples 1, 2 and 3 using high molecular weight polymers. This is probably because the polymer having a lower molecular weight has a smaller molecular size, which contributes to a reduction of LER. When the resists using polymers having indene units incorporated instead of acenaphthylene units in Examples 1 to 4 were processed, patterns having equivalent values of LER could be formed.

With respect to EB sensitivity, the resists using polymers synthesized in the absence of thiol in Comparative Examples 1 to 3 showed an optimum dose of 17 to 19 μC/cm², whereas the resists using polymers synthesized in the presence of thiol in Examples 1 to 10 showed an optimum dose of 7 to 8 μC/cm², indicating a higher sensitivity. This is probably because the sulfur atom introduced into the polymer chain enhances the efficiency of acid generation from the acid generator. A comparison of sensitivity between polymers having chlorostyrene units and methoxystyrene units introduced therein, respectively (a comparison of Examples 1, 2 with Examples 3, 4, or of Examples 5, 6 with Examples 7, 8) reveals that a higher sensitivity results from methoxystyrene. This is probably because styrene units having an electron donative group substituted thereon are more liable to crosslinking reaction.

As for etch resistance, the resists using polymers having acenaphthylene units incorporated therein (Examples 5 to 10, Comparative Examples 1 to 3) show a film thickness reduction which corresponds to 90% of that of the resists using polymers having indene units incorporated therein (Examples 1 to 4), indicating that acenaphthylene units are superior in etch resistance.

Examples 11 to 16

Negative resist compositions shown in Table 3 were prepared as in Examples 1 to 10 except that both an amine compound containing a carboxyl group, but not hydrogen in covalent bond with nitrogen serving as basic center and an amine compound free of a carboxyl group were used. They were similarly processed to form negative resist patterns. Resolution and pattern profile were similarly evaluated.

In all Examples covering any combinations of Quenchers 1 to 4, amine compounds containing a carboxyl group, but not active hydrogen, with Quenchers 5 to 7, amine compounds free of a carboxyl group, 35-nm size patterns having low values of LER were formed without undercuts.

TABLE 3

| Formulation | Example | | | | | |
|---|---|---|---|---|---|---|
| (pbw) | 11 | 12 | 13 | 14 | 15 | 16 |
| Polymer-7 | 80 | 80 | 80 | 80 | 80 | 80 |
| PAG-1 | 10 | 10 | 10 | 10 | 10 | 10 |
| Crosslinker | 8.2 | 8.2 | 8.2 | 8.2 | 8.2 | 8.2 |
| Quencher-1 | | | | 0.1 | | |
| Quencher-2 | | | | | 0.1 | |
| Quencher-3 | | | | | | 0.1 |
| Quencher-4 | 0.1 | 0.1 | 0.1 | | | |
| Quencher-5 | 0.1 | | | | 0.1 | 0.1 |
| Quencher-6 | | 0.1 | | | | |
| Quencher-7 | | | 0.1 | | | |
| Surfactant A | 0.07 | 0.07 | 0.07 | 0.07 | 0.07 | 0.07 |
| Solvent A | 800 | 800 | 800 | 800 | 800 | 800 |
| Solvent B | 1,800 | 1,800 | 1,800 | 1,800 | 1,800 | 1,800 |
| LER | 3.8 | 3.9 | 3.8 | 4.0 | 3.9 | 3.9 |

Examples 17 to 26 and Comparative Example 4

Negative resist compositions shown in Table 4 were prepared as in Examples 1 to 10 except that acid generator PAG-2 was used instead of PAG-1. They were similarly processed to form negative resist patterns. Resolution and pattern profile were similarly evaluated, with the results shown in Table 5.

PAG-2 generates a low diffusive acid as compared with PAG-1, providing a low crosslinking efficiency. As a result, the compositions of Examples 17 to 26 have a sensitivity which is lower by 2 μC/cm² than Examples 1 to 10. Etch resistance remained unchanged with different acid generators.

In all Examples, patterns with a size of 45 nm or less were formed without undercuts and bridges. They had low values of LER.

TABLE 4

| Formulation | Example | | | | | | | | | | Comparative Example |
|---|---|---|---|---|---|---|---|---|---|---|---|
| (pbw) | 17 | 18 | 19 | 20 | 21 | 22 | 23 | 24 | 25 | 26 | 4 |
| Polymer-1 | 80 | | | | | | | | | | |
| Polymer-2 | | 80 | | | | | | | | | |
| Polymer-3 | | | 80 | | | | | | | | |
| Polymer-4 | | | | 80 | | | | | | | |
| Polymer-5 | | | | | 80 | | | | | | |

TABLE 4-continued

| Formulation | Example | | | | | | | | | | Comparative Example |
|---|---|---|---|---|---|---|---|---|---|---|---|
| (pbw) | 17 | 18 | 19 | 20 | 21 | 22 | 23 | 24 | 25 | 26 | 4 |
| Polymer-6 | | | | | | 80 | | | | | |
| Polymer-7 | | | | | | | 80 | | | | |
| Polymer-8 | | | | | | | | 80 | | | |
| Polymer-9 | | | | | | | | | 80 | | |
| Polymer-10 | | | | | | | | | | 80 | |
| Polymer-12 | | | | | | | | | | | 80 |
| PAG-2 | 10 | 10 | 10 | 10 | 10 | 10 | 10 | 10 | 10 | 10 | 10 |
| Crosslinker | 8.2 | 8.2 | 8.2 | 8.2 | 8.2 | 8.2 | 8.2 | 8.2 | 8.2 | 8.2 | 8.2 |
| Quencher-1 | 0.1 | 0.1 | 0.1 | 0.1 | 0.1 | 0.1 | 0.1 | 0.1 | 0.1 | 0.1 | 0.1 |
| Quencher-4 | 0.1 | 0.1 | 0.1 | 0.1 | 0.1 | 0.1 | 0.1 | 0.1 | 0.1 | 0.1 | 0.1 |
| Surfactant A | 0.07 | 0.07 | 0.07 | 0.07 | 0.07 | 0.07 | 0.07 | 0.07 | 0.07 | 0.07 | 0.07 |
| Solvent A | 800 | 800 | 800 | 800 | 800 | 800 | 800 | 800 | 800 | 800 | 800 |
| Solvent B | 1,800 | 1,800 | 1,800 | 1,800 | 1,800 | 1,800 | 1,800 | 1,800 | 1,800 | 1,800 | 1,800 |

TABLE 5

| | | Resolution (nm) | Profile | LER | EB sensitivity | Etch resistance (relative film thickness reduction) |
|---|---|---|---|---|---|---|
| Example | 17 | 45 | Good | 4.2 | 10 | 1.0 |
| | 18 | 45 | Good | 4.3 | 10 | 1.0 |
| | 19 | 40 | Good | 4.1 | 9 | 1.0 |
| | 20 | 40 | Good | 4.1 | 9 | 1.0 |
| | 21 | 40 | Good | 4.2 | 10 | 0.9 |
| | 22 | 40 | Good | 3.9 | 10 | 0.9 |
| | 23 | 35 | Good | 4.0 | 9 | 0.9 |
| | 24 | 35 | Good | 3.9 | 9 | 0.9 |
| | 25 | 40 | Good | 4.0 | 9 | 0.9 |
| | 26 | 40 | Good | 4.0 | 9 | 0.9 |
| Comparative Example | 4 | 50 | Good | 6.3 | 20 | 0.9 |

Examples 27 to 36 and Comparative Examples 5 to 7

Negative resist compositions shown in Table 6 were prepared as in Examples 1 to 10 except that the amount of solvent was increased. They were similarly processed to form negative resist patterns. Albite the same coating conditions, the thickness of resist film was 60 nm due to the solvent dilution. Resolution and pattern profile were similarly evaluated, with the results shown in Table 7.

The resist films showed a sensitivity which was lower by 1 $\mu C/cm^2$ than Examples 1 to 10 on account of the reduced thickness, but an improved resolution. Etch resistance remained unchanged though the film thickness was different.

In all Examples, patterns with a size of 40 nm or less were formed without undercuts and bridges.

TABLE 6

| Formulation | Example | | | | | | |
|---|---|---|---|---|---|---|---|
| (pbw) | 27 | 28 | 29 | 30 | 31 | 32 | 33 |
| Polymer-1 | 80 | | | | | | |
| Polymer-2 | | 80 | | | | | |
| Polymer-3 | | | 80 | | | | |
| Polymer-4 | | | | 80 | | | |
| Polymer-5 | | | | | 80 | | |
| Polymer-6 | | | | | | 80 | |
| Polymer-7 | | | | | | | 80 |
| Polymer-8 | | | | | | | |
| Polymer-9 | | | | | | | |
| Polymer-10 | | | | | | | |
| Polymer-11 | | | | | | | |
| Polymer-12 | | | | | | | |
| Polymer-13 | | | | | | | |
| PAG-2 | 10 | 10 | 10 | 10 | 10 | 10 | 10 |
| Crosslinker | 8.2 | 8.2 | 8.2 | 8.2 | 8.2 | 8.2 | 8.2 |
| Quencher-1 | 0.1 | 0.1 | 0.1 | 0.1 | 0.1 | 0.1 | 0.1 |
| Quencher-4 | 0.1 | 0.1 | 0.1 | 0.1 | 0.1 | 0.1 | 0.1 |
| Surfactant A | 0.07 | 0.07 | 0.07 | 0.07 | 0.07 | 0.07 | 0.07 |
| Solvent A | 1,100 | 1,100 | 1,100 | 1,100 | 1,100 | 1,100 | 1,100 |
| Solvent B | 2,600 | 2,600 | 2,600 | 2,600 | 2,600 | 2,600 | 2,600 |

| Formulation | Example | | | Comparative Example | | |
|---|---|---|---|---|---|---|
| (pbw) | 34 | 35 | 36 | 5 | 6 | 7 |
| Polymer-1 | | | | | | |
| Polymer-2 | | | | | | |
| Polymer-3 | | | | | | |
| Polymer-4 | | | | | | |

TABLE 6-continued

| | | | | | | |
|---|---|---|---|---|---|---|
| Polymer-5 | | | | | | |
| Polymer-6 | | | | | | |
| Polymer-7 | | | | | | |
| Polymer-8 | 80 | | | | | |
| Polymer-9 | | 80 | | | | |
| Polymer-10 | | | 80 | | | |
| Polymer-11 | | | | 80 | | |
| Polymer-12 | | | | | 80 | |
| Polymer-13 | | | | | | 80 |
| PAG-2 | 10 | 10 | 10 | 10 | 10 | 10 |
| Crosslinker | 8.2 | 8.2 | 8.2 | 8.2 | 8.2 | 8.2 |
| Quencher-1 | 0.1 | 0.1 | 0.1 | 0.1 | 0.1 | 0.1 |
| Quencher-4 | 0.1 | 0.1 | 0.1 | 0.1 | 0.1 | 0.1 |
| Surfactant A | 0.07 | 0.07 | 0.07 | 0.07 | 0.07 | 0.07 |
| Solvent A | 1,100 | 1,100 | 1,100 | 1,100 | 1,100 | 1,100 |
| Solvent B | 2,600 | 2,600 | 2,600 | 2,600 | 2,600 | 2,600 |

TABLE 7

| | | Resolution (nm) | Profile | LER | EB sensitivity | Etch resistance (relative film thickness reduction) |
|---|---|---|---|---|---|---|
| Example | 27 | 40 | Good | 4.2 | 9 | 1.0 |
| | 28 | 40 | Good | 4.1 | 9 | 1.0 |
| | 29 | 35 | Good | 4.1 | 8 | 1.0 |
| | 30 | 35 | Good | 4.1 | 8 | 1.0 |
| | 31 | 35 | Good | 4.0 | 9 | 0.9 |
| | 32 | 35 | Good | 4.0 | 9 | 0.9 |
| | 33 | 30 | Good | 3.8 | 8 | 0.9 |
| | 34 | 30 | Good | 3.9 | 8 | 0.9 |
| | 35 | 35 | Good | 4.0 | 9 | 0.9 |
| | 36 | 35 | Good | 4.1 | 9 | 0.9 |
| Comparative Example | 5 | 45 | Good | 6.2 | 21 | 0.9 |
| | 6 | 45 | Good | 6.2 | 21 | 0.9 |
| | 7 | 45 | Good | 6.4 | 19 | 0.9 |

As demonstrated above, the resist compositions of the invention are used to form resist films having a high sensitivity and high imaging throughput, from which patterns having low LER are formed. The resist compositions comprising an amine compound having a carboxyl group, but free of hydrogen in covalent bond with nitrogen as basic center suffer little substrate poisoning. Moreover, the resist composition also has effective sensitivity even when an acid generator having a bulky anion is used. The pattern forming process using the same is useful in the photolithography for the fabrication of semiconductor devices and especially the processing of photomask blanks.

Japanese Patent Application No. 2010-004811 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A chemically amplified negative resist composition comprising (A) a base polymer, (B) an acid generator, and (C) a nitrogen-containing compound as a basic component, said base polymer being (i) a polymer comprising recurring units of the general formulae (1) and (2):

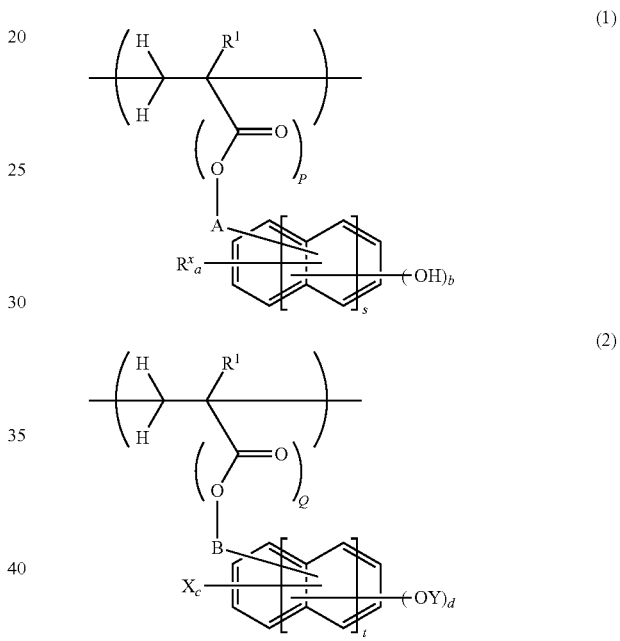

wherein A and B each are a single bond or a $C_1$-$C_{10}$ alkylene group which may be separated by an ether bond, $R^1$ is each independently hydrogen or methyl, $R^x$ is each independently hydrogen or a $C_1$-$C_6$ alkyl group, X is hydrogen, a straight, branched or cyclic $C_1$-$C_{20}$ alkyl group, $C_2$-$C_{20}$ alkoxyalkyl group, $C_2$-$C_{20}$ alkylthioalkyl group, halogen, nitro, or cyano, sulfinyl or sulfonyl group, Y is a $C_1$-$C_{20}$ alkyl group or $C_2$-$C_{20}$ acyl group, a and c each are an integer of 0 to 4, b is an integer of 1 to 5, d is an integer of 0 to 5, P and Q each are 0 or 1, s and t each are an integer of 0 to 2, said polymer being combined with a crosslinker capable of forming crosslinks through electrophilic reaction with formula (1) in the presence of an acid, (ii) said polymer further comprising recurring units capable of forming crosslinks through electrophilic reaction with formula (1) in the presence of an acid, or (iii) said polymer further comprising recurring units having a crosslinking function, being combined with a crosslinker capable of forming crosslinks through electrophilic reaction with formula (1) in the presence of an acid, at least a portion of said base polymer having an alkylthio group of the general formula (3):

 (3)

wherein $R^3$ is a straight, branched or cyclic $C_1$-$C_{20}$ alkyl group, $C_2$-$C_{20}$ hydroxyalkyl group, $C_2$-$C_{20}$ alkoxyalkyl group, $C_1$-$C_{20}$ mercaptoalkyl group or $C_2$-$C_{20}$ alkylthioalkyl group, said base polymer having a weight average molecular weight of 1,000 to 2,500.

2. The negative resist composition of claim 1 wherein the base polymer having the alkylthio group of formula (3) introduced therein is obtained from radical polymerization of a monomer mixture comprising monomers having the general formulae (1a) and (2a):

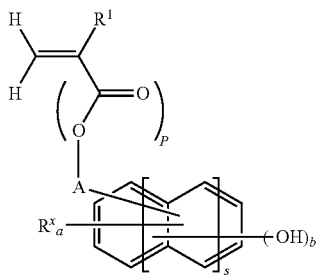
 (1a)

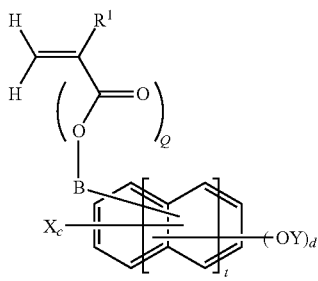
 (2a)

wherein A, B, $R^1$, $R^x$, X, Y, a, c, b, d, P, Q, s and t are as defined above, while using a compound of the general formula (20):

  (20)

wherein $R^3$ is as defined above, as a chain transfer agent.

3. The negative resist composition of claim 1 wherein in the general formula (2), X is at least one substituent selected from the group consisting of hydrogen atom, chlorine atom, bromine atom, iodine atom, methyl group, and ethyl group, and Y is at least one substituent selected from the group consisting of methyl group and ethyl group.

4. The negative resist composition of claim 1 wherein said base polymer further comprises recurring units of the general formula (4) or (5):

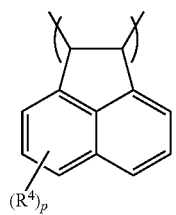
 (4)

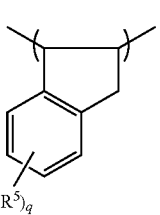
 (5)

wherein $R^4$ and $R^5$ are each independently hydrogen, hydroxyl, a straight, branched or cyclic $C_1$-$C_{20}$ alkoxy group, a straight, branched or cyclic $C_1$-$C_{20}$ acyloxy group, an optionally hydroxy-substituted, straight, branched or cyclic $C_1$-$C_{20}$ alkyl group, or halogen, p is 0 or an integer of 1 to 6, and q is 0 or an integer of 1 to 4.

5. The negative resist composition of claim 1 wherein said acid generator (B) comprises at least one compound having the general formula (6):

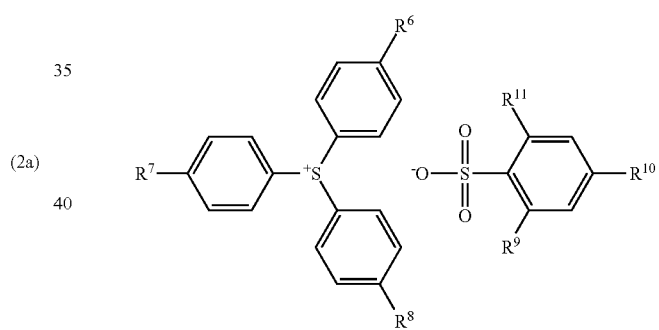
 (6)

wherein $R^6$, $R^7$ and $R^8$ are each independently hydrogen or a straight or branched $C_1$-$C_4$ alkyl group, $R^9$, $R^{10}$ and $R^{11}$ are each independently a straight or branched $C_3$-$C_{10}$ alkyl group.

6. The negative resist composition of claim 1 wherein said basic component (C) comprises at least one compound selected from compounds having the general formulae (7) to (9):

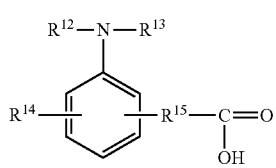
 (7)

wherein $R^{12}$ and $R^{13}$ are each independently a straight, branched or cyclic $C_1$-$C_{20}$ alkyl group, $C_6$-$C_{20}$ aryl group, $C_7$-$C_{20}$ aralkyl group, $C_2$-$C_{20}$ hydroxyalkyl group, $C_2$-$C_{20}$ alkoxyalkyl group, $C_2$-$C_{20}$ acyloxyalkyl group, or $C_2$-$C_{20}$ alkylthioalkyl group, or $R^{12}$ and $R^{13}$ may bond together to form a ring structure with the nitrogen atom to which they are attached, $R^{14}$ is hydrogen, a straight, branched or cyclic $C_1$-$C_{20}$ alkyl group, $C_6$-$C_{20}$ aryl group, $C_7$-$C_{20}$ aralkyl group, $C_2$-$C_{20}$ hydroxyalkyl group, $C_2$-$C_{20}$ alkoxyalkyl group, $C_2$-$C_{20}$ acyloxyalkyl group, $C_2$-$C_{20}$ alkylthioalkyl group, or halogen, $R^{15}$ is a single bond, a straight, branched or cyclic $C_1$-$C_{20}$ alkylene group, or $C_6$-$C_{20}$ arylene group,

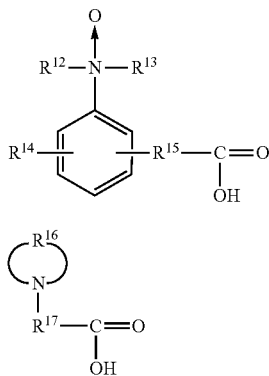

wherein $R^{12}$ and $R^{13}$ are each independently a straight, branched or cyclic $C_1$-$C_{20}$ alkyl group, $C_6$-$C_{20}$ aryl group, $C_7$-$C_{20}$ aralkyl group, $C_2$-$C_{20}$ hydroxyalkyl group, $C_2$-$C_{10}$ alkoxyalkyl group, $C_2$-$C_{20}$ acyloxyalkyl group, or $C_2$-$C_{20}$ alkylthioalkyl group, or $R^{12}$ and $R^{13}$ may bond together to form a ring structure with the nitrogen atom to which they are attached, $R^{14}$ is hydrogen, a straight, branched or cyclic $C_1$-$C_{20}$ alkyl group, $C_6$-$C_{20}$ aryl group, $C_7$-$C_{20}$ aralkyl group, $C_2$-$C_{20}$ hydroxyalkyl group, $C_2$-$C_{20}$ alkoxyalkyl group, $C_2$-$C_{20}$ acyloxyalkyl group, $C_2$-$C_{20}$ alkylthioalkyl group, or halogen, $R^{15}$ is a single bond, a straight, branched or cyclic $C_1$-$C_{20}$ alkylene group, or $C_6$-$C_{20}$ arylene group, $R^{16}$ is an optionally substituted, straight or branched $C_2$-$C_{20}$ alkylene group whose carbon-carbon linkage may be separated by at least one carbonyl, ether, ester or sulfide group, and $R^{17}$ is a straight, branched or cyclic $C_1$-$C_{20}$ alkylene group or $C_6$-$C_{20}$ arylene group.

7. The negative resist composition of claim 6, further comprising at least one compound selected from amine and amine oxide compounds having the general formulae (10) and (11):

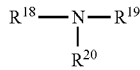

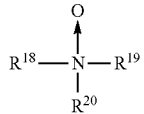

wherein $R^{18}$, $R^{19}$ and $R^{20}$ are each independently hydrogen, a straight, branched or cyclic $C_1$-$C_{20}$ alkyl group, $C_6$-$C_{20}$ aryl group, $C_7$-$C_{20}$ aralkyl group, $C_2$-$C_{20}$ hydroxyalkyl group, $C_2$-$C_{20}$ alkoxyalkyl group, $C_2$-$C_{20}$ acyloxyalkyl group, or $C_2$-$C_{20}$ alkylthioalkyl group, any two of $R^{18}$, $R^{19}$ and $R^{20}$ may bond together to form a ring structure or aromatic ring with the nitrogen atom to which they are attached.

8. A process for forming a resist pattern, comprising the steps of:
   applying the negative resist composition of claim 1 onto a processable substrate to form a resist film,
   exposing the film to a pattern of high-energy radiation,
   optionally post-exposure baking the film, and
   developing the exposed film with an aqueous alkaline developer.

9. The process of claim 8 wherein the resist film has a thickness of 10 nm to 100 nm.

10. The process of claim 8 wherein the processable substrate is a photomask blank.

11. The process of claim 10 wherein the photomask blank comprises a chromium compound film as the outermost layer.

* * * * *